(12) United States Patent
Tokiwa

(10) Patent No.: US 11,099,787 B2
(45) Date of Patent: *Aug. 24, 2021

(54) SEMICONDUCTOR MEMORY

(71) Applicant: KIOXIA CORPORATION, Tokyo (JP)

(72) Inventor: Naoya Tokiwa, Fujisawa Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/841,335

(22) Filed: Apr. 6, 2020

(65) Prior Publication Data

US 2020/0233613 A1 Jul. 23, 2020

Related U.S. Application Data

(63) Continuation of application No. 16/118,412, filed on Aug. 30, 2018, now Pat. No. 10,642,537.

(30) Foreign Application Priority Data

Nov. 30, 2017 (JP) .............................. JP2017-230595

(51) Int. Cl.
*G11C 11/34* (2006.01)
*G06F 3/06* (2006.01)
*G11C 7/10* (2006.01)
*G11C 16/32* (2006.01)
*G11C 16/08* (2006.01)
*G11C 16/24* (2006.01)

(52) U.S. Cl.
CPC .......... *G06F 3/0659* (2013.01); *G06F 3/0656* (2013.01); *G11C 7/109* (2013.01); *G11C 7/1063* (2013.01); *G11C 16/08* (2013.01); *G11C 16/24* (2013.01); *G11C 16/32* (2013.01); *G11C 7/1051* (2013.01); *G11C 7/1078* (2013.01)

(58) Field of Classification Search
CPC ..... G06F 3/0659; G06F 3/0656; G11C 7/109; G11C 16/32; G11C 16/08; G11C 16/24; G11C 7/1063; G11C 7/1051; G11C 7/1078; G11C 16/0483; G11C 16/26
USPC ................................................. 365/161, 174
See application file for complete search history.

(56) References Cited

U.S. PATENT DOCUMENTS

| 7,936,004 B2 | 5/2011 | Kito et al. |
| 9,368,214 B2 | 6/2016 | Kasorla et al. |
| 9,443,600 B2 | 9/2016 | Ghalam et al. |

(Continued)

*Primary Examiner* — Hoai V Ho
*Assistant Examiner* — Minh Dinh
(74) *Attorney, Agent, or Firm* — Kim & Stewart LLP

(57) ABSTRACT

A semiconductor memory includes a first plane that includes a first memory cell array, a second plane that includes a second memory cell array, and a control circuit that includes a first circuit configured to store a first priority for a first operation performed on the first plane and a second circuit configured to store a second priority for a second operation performed on the second plane, and is configured to control the first and second operations based on the first priority and the second priority. When a value of the second priority is higher than a value of the first priority, the control circuit controls the first operation such that a timing of a process executed in the first operation does not overlap with a timing of a process executed in the second operation.

20 Claims, 21 Drawing Sheets

(56) References Cited

U.S. PATENT DOCUMENTS

| | | | |
|---|---|---|---|
| 10,642,537 B2* | 5/2020 | Tokiwa | G06F 3/0659 |
| 2010/0329013 A1 | 12/2010 | Shikata et al. | |
| 2013/0128675 A1 | 5/2013 | Kim et al. | |
| 2015/0071005 A1 | 3/2015 | Maejima et al. | |
| 2018/0203796 A1 | 7/2018 | Park et al. | |

* cited by examiner

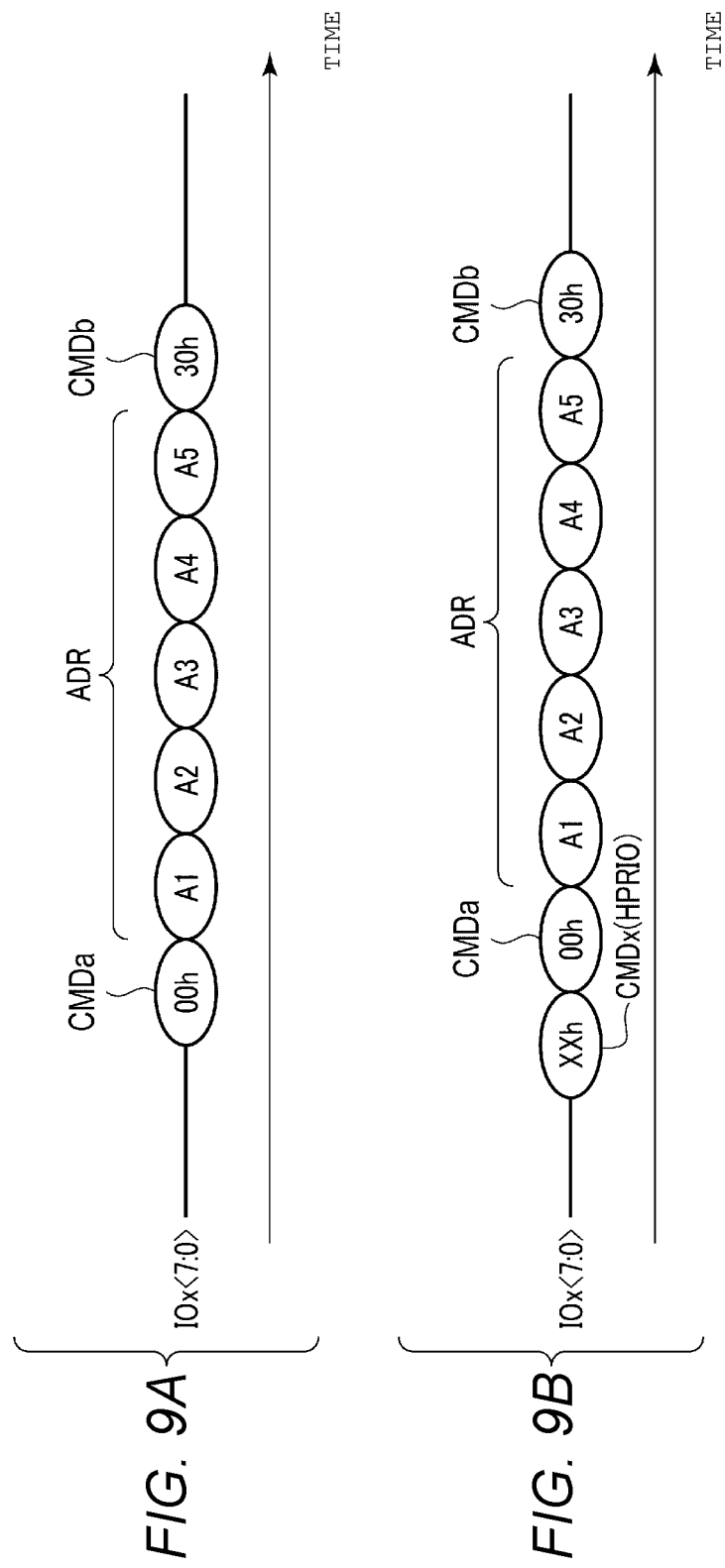

SEMICONDUCTOR MEMORY

CROSS-REFERENCE TO RELATED APPLICATIONS

This application is a continuation of U.S. patent application Ser. No. 16/118,412, filed Aug. 30, 2018, which application is based upon and claims the benefit of priority from Japanese Patent Application No. 2017-230595, filed Nov. 30, 2017, the entire contents of which are incorporated herein by reference.

FIELD

Embodiments described herein relate generally to a semiconductor memory.

BACKGROUND

Semiconductor memories such as flash memories are used in various electronic devices.

DESCRIPTION OF THE DRAWINGS

FIGS. 9A and 9B are diagrams illustrating a command sequence of the semiconductor memory of the first embodiment.

DETAILED DESCRIPTION

In general, according to one embodiment, a semiconductor memory includes a first plane that includes a first memory cell array, a second plane that includes a second memory cell array, and a control circuit that includes a first circuit configured to store a first priority for a first operation performed on the first plane and a second circuit configured to store a second priority for a second operation performed on the second plane, and is configured to control the first and second operations based on the first priority and the second priority. When a value of the second priority is higher than a value of the first priority, the control circuit controls the first operation such that a timing of a process executed in the first operation does not overlap with a timing of a process executed in the second operation.

Embodiments

A semiconductor memory and a memory system of embodiments will be described with reference to FIG. 1 to FIG. 25.

Hereinafter, the present embodiments will be described in detail with reference to the drawings. In the following description, elements having the same function and the same configuration are given the same reference numbers.

In each of the following embodiments, when elements that are given reference numbers with numbers/letters appended for distinction (for example, word lines WL and bit lines BL, and various voltages and signals) do not need to be distinguished from each other, the elements will be described without the appended numbers/letters.

(1) First Embodiment

A semiconductor memory and a memory system of a first embodiment will be described with reference to FIG. 1 to FIG. 20.

(a) Configuration Example

A configuration example of the semiconductor memory and the memory system of the first embodiment will be described with reference to FIG. 1 to FIG. 10C.

(a-1) Memory System

Figure 1:
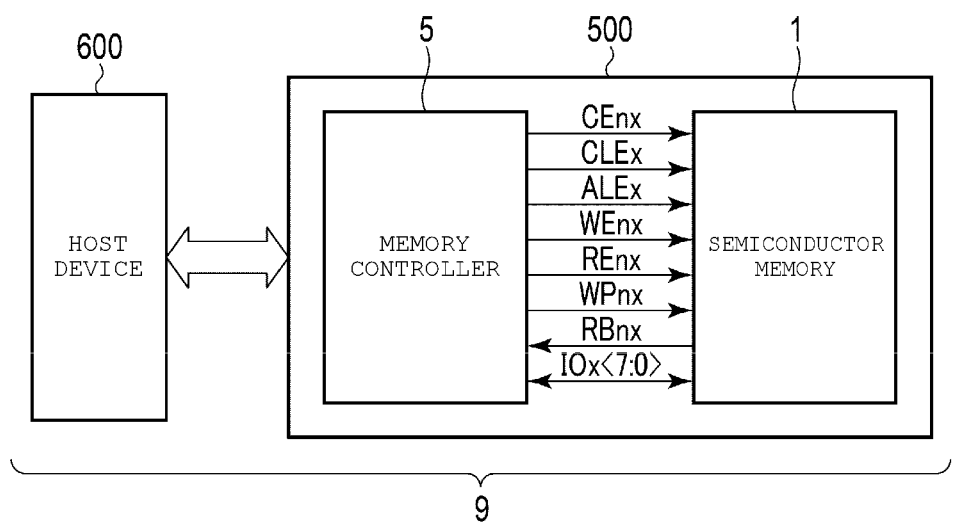
FIG. 1 is a schematic diagram of a semiconductor memory and a memory system of a first embodiment.

FIG. 1 is a schematic diagram illustrating a configuration example of the memory system that includes the semiconductor memory of the present embodiment.

FIG. 1 is a diagram illustrating the memory system of the present embodiment.

As illustrated in FIG. 1, a memory system 9 of the present embodiment includes a storage device 500 and a host device 600.

For example, the host device 600 is connected to the storage device 500 through a connector, a cable, wireless communication, or the Internet. The host device 600 requests the storage device 500 to write data, read data, and erase data.

The storage device 500 includes a memory controller 5 and a semiconductor memory 1.

The memory controller 5 causes the semiconductor memory 1 to execute an operation in response to the request from the host device 600. The memory controller 5 issues a command for causing the semiconductor memory 1 to execute the operation. The memory controller 5 transmits the issued command to the semiconductor memory 1. The command is a signal that indicates the operation to be executed by the semiconductor memory 1.

For example, the memory controller 5 includes a processor (CPU), an embedded memory (for example, a DRAM), a buffer memory (for example, an SRAM), and an ECC circuit. The processor controls the operation of the entire memory controller 5. The embedded memory temporarily stores programs (software/firmware) and management information (management table) related to the storage device/semiconductor memory. The buffer memory temporarily stores data that is transmitted and received between the semiconductor memory 1 and the host device 600. The ECC circuit detects an error in data read from the semiconductor memory 1, and corrects the detected error.

The semiconductor memory 1 stores data. The semiconductor memory 1 writes data, reads data, and erases data based on the command from the memory controller 5.

The semiconductor memory 1 is, for example, a NAND flash memory. The storage device 500 (or the memory system 9) that includes the semiconductor memory 1 is, for example, a memory card (for example, an SD™ card or eMMC™), a USB memory, or a solid state drive (SSD).

For example, the semiconductor memory 1 includes a plurality of chips.

Various signals are transmitted and received between the semiconductor memory 1 and the memory controller 5. For example, a chip enable signal CEnx, a command latch enable signal CLEx, an address latch enable signal ALEx, a write enable signal WEnx, a read enable signal REnx, and a write protect signal WPnx for controlling a corresponding memory chip having an identification number "x" among the plurality of memory chips are used as control signals that are based on a NAND interface standard between the flash memory 1 and the memory controller 5. The identification number "x" denotes an integer greater than or equal to zero.

The signal CEnx is a signal for enabling a certain chip of the semiconductor memory 1. The signal CLEx is a signal for providing a notification that a signal that is supplied to I/O terminals (I/O line) IOx<7:0> is a command. The signal ALEx is a signal for providing a notification that a signal that is supplied to the I/O terminals IOx<7:0> is an address. The signal WEnx is, for example, a signal that provides an instruction to input a signal via the I/O terminals IOx<7:0>. The signal REnx is, for example, a signal that provides an instruction to output a signal via the I/O terminals IOx<7:0>. The signal WPnx is, for example, a signal for setting the semiconductor memory 1 to a protection state when power is ON and OFF.

Hereinafter, signals that are input and output from the I/O terminal will be referred to as I/O signals when the types of signals input and output from the I/O terminal are not distinguished from each other.

A ready/busy signal RBnx is generated based on the operating state of the semiconductor memory 1. The ready/busy signal RBnx is transmitted to the memory controller 5 from the semiconductor memory 1. The ready/busy signal RBnx is a signal for notifying the memory controller 5 of whether the semiconductor memory 1 is in a ready state (a state where a command from the memory controller 5 is received) or a busy state (a state where a command from the memory controller 5 is not received). For example, the ready/busy signal RBnx is set to a level "L" (low) (busy state) while the semiconductor memory 1 performs an operation such as reading data, and is set to a level "H" (high) (ready state) when the operation is complete.

(a-2) Flash Memory

Figure 2:
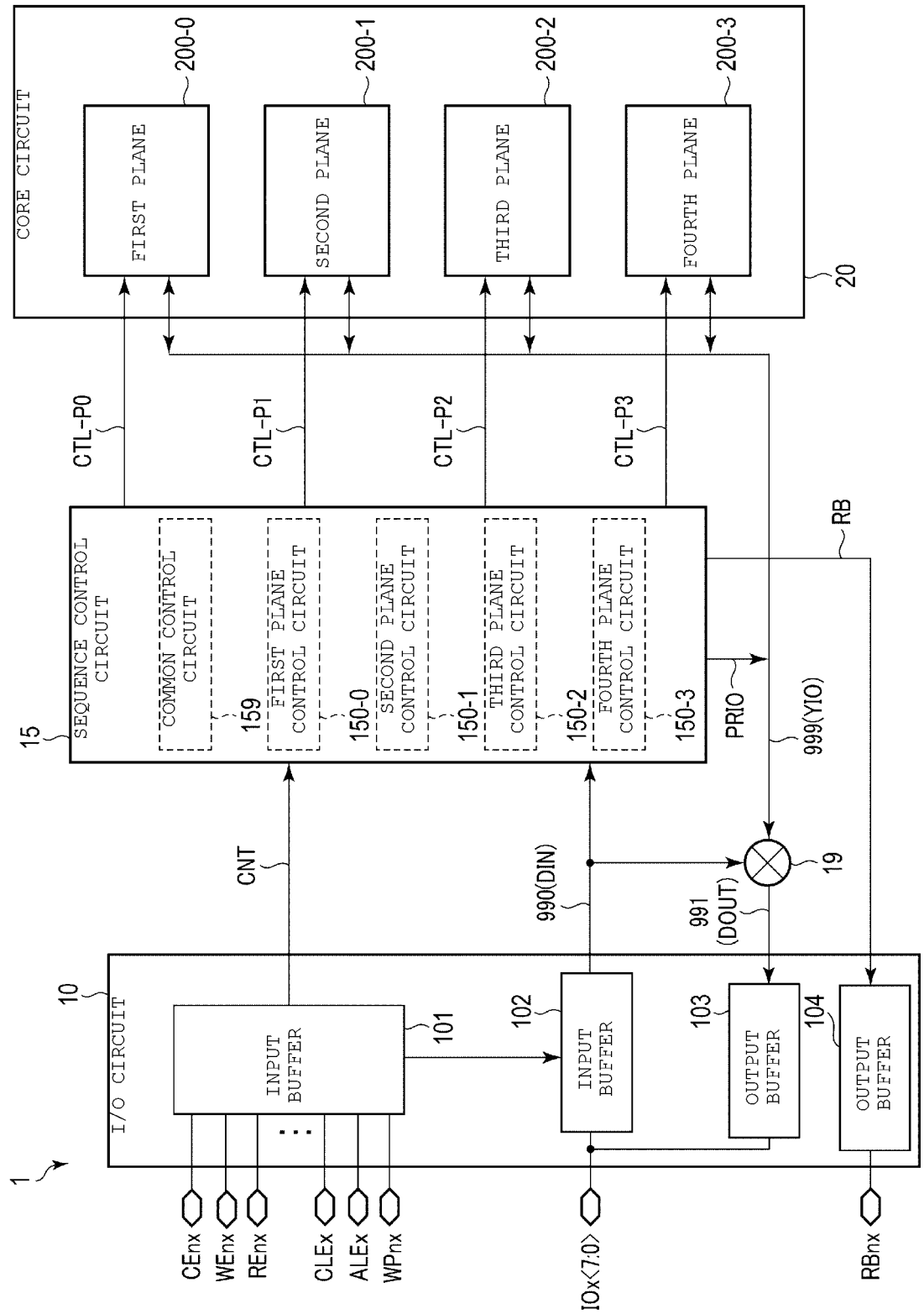
FIG. 2 is a block diagram of the semiconductor memory of the first embodiment.

FIG. 2 is a block diagram illustrating a configuration example of the semiconductor memory of the present embodiment.

As illustrated in FIG. 2, the semiconductor memory 1 includes an input-output circuit (I/O circuit) 10, a sequence control circuit 15, a core circuit 20, and the like.

The I/O circuit 10 includes input buffer circuits 101 and 102 and output buffer circuits 103 and 104.

The input buffer circuits 101 and 102 receive signals and data from the memory controller 5.

The input buffer circuit 101 is connected to a plurality of external control terminals (control lines). The input buffer circuit 101 receives the signals CEnx, WEnx, REnx, CLEx, ALEx, and WPnx. The external control terminals are disposed in the semiconductor memory 1 in correspondence with the signals CEnx, WEnx, REnx, CLEx, ALEx, and WPnx.

The input buffer circuit 101 outputs an internal control signal CNT to the sequence control circuit 15. The internal control signal CNT is generated and controlled based on the various signals CEnx, WEnx, REnx, CLEx, ALEx, and WPnx.

The input buffer circuit 102 is connected to the eight I/O terminals IOx<7:0>. The input buffer circuit 102 receives a command, an address, and data.

The input buffer circuit 102 outputs a signal DIN to the sequence control circuit 15 and a multiplexer 19 via a data bus 990. The signal DIN corresponds to the command, the address, and the data (e.g., write data).

The output buffer circuits 103 and 104 transmit signals and data of the semiconductor memory 1 to the memory controller 5.

The output buffer circuit 103 is connected to the I/O terminals IOx<7:0>. The output buffer circuit 103 receives a signal DOUT from the core circuit 20 via the multiplexer 19 and data buses 991 and 999. The output buffer circuit 103 outputs the received signal DOUT to the memory controller 5 from the I/O terminals IOx<7:0>. For example, the signal DOUT is data that is read from a memory cell array of the semiconductor memory 1.

The output buffer circuit 104 is connected to the ready/busy terminal (ready/busy line) RBnx. The output buffer circuit 104 receives an internal ready/busy signal RB from the sequence control circuit 15. The output buffer circuit 104 outputs the ready/busy signal RBnx to the memory controller 5. The memory controller 5 is notified of the state of the semiconductor memory using the ready/busy signal RBnx. For example, the signal level of the ready/busy signal RBnx is controlled based on the signal level of the internal ready/busy signal RB.

The core circuit 20 includes a plurality of planes 200 (200-0, 200-1, 200-2, and 200-3). Each plane 200 is a circuit area that includes a memory cell array 201. An internal configuration of the plane will be described later.

In the present embodiment, for example, four planes 200 are disposed in the core circuit 20. Each of the four planes 200 is controlled by a different signal CTL (CTL-P0 to CTL-P3).

Hereinafter, for distinction of the signal for each plane, the reference sign of the signal for the first plane 200-0 (P0) will be given "-P0" in order to indicate that the signal is for the first plane 200-0. Similarly, the reference sign of the signal for the second plane (P1) 200-1 will be given "-P1". The reference sign of the signal for the third plane (P2) 200-2 will be given "-P2". The reference sign of the signal for the fourth plane (P3) 200-3 will be given "-P3".

While the semiconductor memory that includes the four planes 200 is illustrated in the semiconductor memory of the present embodiment, the number of planes of the semiconductor memory may be two or more.

The sequence control circuit (also referred to as an internal controller or a state machine) 15 controls each circuit in the semiconductor memory 1.

The sequence control circuit 15 receives the internal control signal CNT and the signal DIN (containing the command, the address, or the data).

Based on the internal control signal CNT and the signal DIN, the sequence control circuit 15 generates the signal (hereinafter, referred to as a core control signal) CTL (CTL-P0, CTL-P1, CTL-P2, and CTL-P3) for controlling the core circuit 20.

The sequence control circuit 15 outputs the core control signal CTL to the core circuit 20. The core control signal CTL is supplied to the plurality of planes 200 (200-0, 200-1, 200-2, and 200-3), described later, in the core circuit 20.

The sequence control circuit 15 outputs the internal ready/busy signal RB to the output buffer circuit 104. The sequence control circuit 15 controls the signal level (logical state) of the internal ready/busy signal RB depending on the operating status of the core circuit 20.

The sequence control circuit 15 can output a signal PRIG, described later, based on the operating states of the plurality of planes 200.

For example, the sequence control circuit 15 includes a plurality of plane control circuits 150 (150-0, 150-1, 150-2, and 150-3).

One of the plurality of plane control circuits 150 corresponds to one of the plurality of planes 200. For example, the first plane control circuit 150-0 controls the operation of the first plane 200-0. The second plane control circuit 150-1 controls the operation of the second plane 200-1. The third plane control circuit 150-2 controls the operation of the third plane 200-2. The fourth plane control circuit 150-3 controls the operation of the fourth plane 200-3.

The sequence control circuit 15 includes a common control circuit 159. The common control circuit 159 controls the plurality of planes 200 and the plurality of plane control circuits 150 in common.

The control circuits 150 and 159 are integrated in the sequence control circuit 15. Each of the control circuits 150 has a function of controlling the corresponding plane 200.

The multiplexer 19 is connected to the data buses 990, 991, and 999. The data bus 999 connects the core circuit 20 to the multiplexer 19. An internal data signal YIO is a signal that is transmitted and received between the multiplexer 19 and the core circuit 20.

A signal (for example, the signal PRIO) from the sequence control circuit 15 may be supplied to the data bus 999. In this case, for example, the signal PRIG is output to the memory controller 5 from the I/O terminals IOx.

The multiplexer 19 connects the core circuit 20 to one of the input buffer circuit 102 or the output buffer circuit 103 under control of the sequence control circuit 15 depending on the operation of the semiconductor memory 1. Accordingly, in a write operation of the semiconductor memory 1, the signal DIN is supplied to the core circuit 20 from the input buffer circuit 102 via the data buses 990 and 999. When a read operation of the semiconductor memory 1 is performed, the signal DOUT is supplied to the output buffer circuit 103 from the core circuit 20 via the data buses 991 and 999.

For example, the semiconductor memory 1 includes a voltage generation circuit (not illustrated) in addition to the above circuits. The voltage generation circuit generates various voltages for the operations of the planes 200.

When the semiconductor memory 1 includes the plurality of planes 200, the memory controller 5 can recognize the plane 200 from which data from the semiconductor memory 1 is read.

Figure 3:
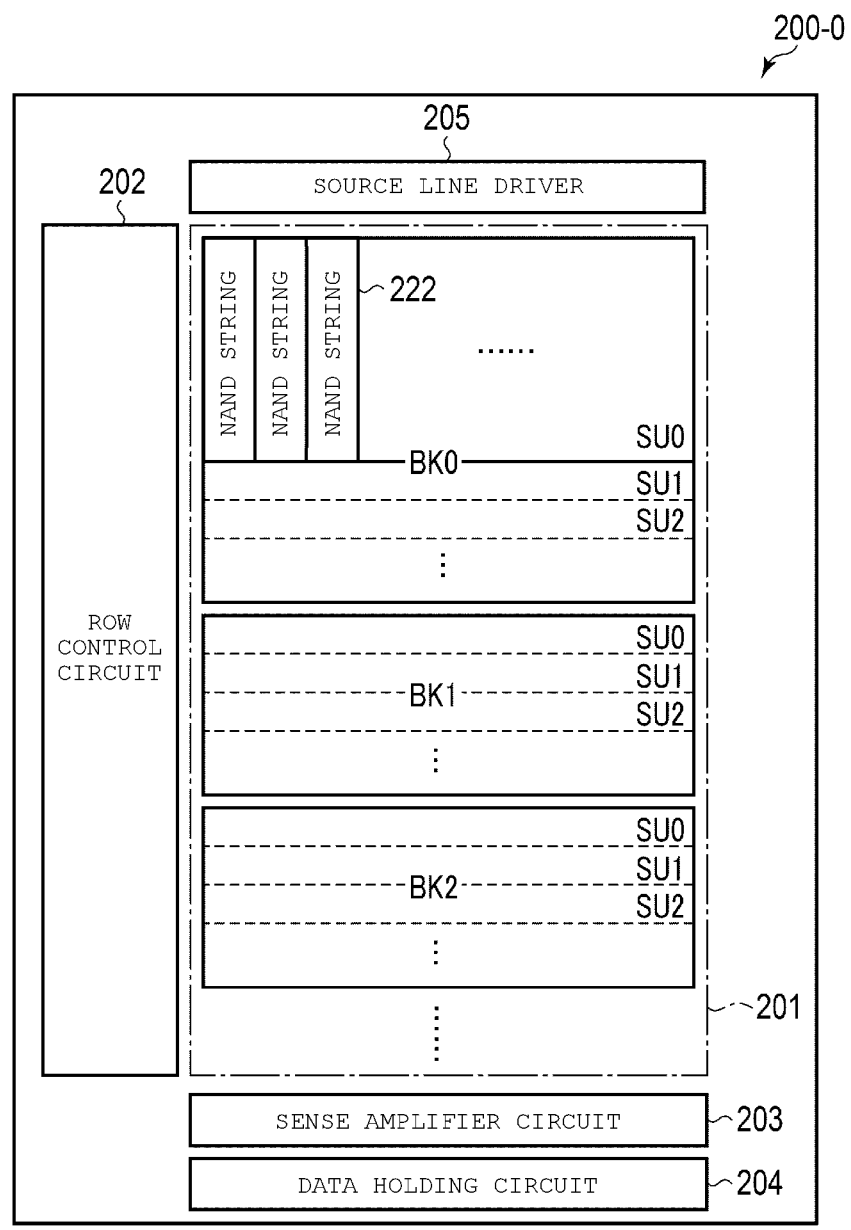
FIG. 3 is a block diagram of a core circuit in the semiconductor memory of the first embodiment.

(a-3) Core Circuit FIG. 3 is a block diagram illustrating a configuration example of the core circuit in the semiconductor memory of the present embodiment.

In FIG. 3, one plane (here, the first plane) in the core circuit is extracted and illustrated.

As illustrated in FIG. 3, the plane 200-0 includes at least the memory cell array 201, a row control circuit 202, a sense amplifier circuit 203, a data holding circuit 204, and a source line driver 205.

The memory cell array 201 includes a plurality of blocks BK (BK0, BK1, BK2, . . . ). Each block BK includes a plurality of string units SU (SU0, SU1, SU2, . . . ). Each string unit SU includes a plurality of NAND strings (memory cell strings) 222. Each NAND string 222 includes a plurality of memory cells.

In the semiconductor memory, for example, each block BK is a unit of erasing data. An erasing operation of the semiconductor memory of the present embodiment is executed in units of blocks. The semiconductor memory of the present embodiment may perform not only an erasing operation in units of blocks but also an erasing operation in units smaller than the blocks BK. For example, the erasing operation that may be employed is disclosed in U.S. patent application Ser. No. 13/235,389, entitled "NONVOLATILE SEMICONDUCTOR MEMORY DEVICE" and filed on Sep. 18, 2011, and U.S. patent application Ser. No. 12/694,690, entitled "NONVOLATILE SEMICONDUCTOR STORAGE DEVICE" and filed on Jan. 27, 2010. The entire contents of these patent applications are incorporated in the present application by reference.

An internal configuration of the memory cell array 201 will be described later.

The row control circuit 202 controls rows (for example, word lines) of the memory cell array 201.

The row control circuit 202 includes a switch circuit, a driver circuit, and the like. The switch circuit activates the selected block BK and the selected string unit SU, and deactivates the other blocks BK and the other string units SU. The driver circuit supplies voltages corresponding to the activation/deactivation of the blocks BK to the blocks BK and the string units SU. Accordingly, the row control circuit 202 charges the word lines depending on the operation to be executed.

When data is read, the sense amplifier circuit 203 senses and amplifies a signal that is output to bit lines in the memory cell array 201. For example, the sense amplifier circuit 203 senses current flow in bit lines (or certain interconnections connected to the bit lines) or a change in the electric potentials of the bit lines, as a signal from a memory cell. Accordingly, the sense amplifier circuit 203 reads data that is held in the memory cell. When data is written, the sense amplifier circuit 203 controls the electric potentials of the bit lines depending on the data to be written. In such a manner, the sense amplifier circuit 203 charges the bit lines depending on the operation to be executed.

The data holding circuit (for example, a page buffer circuit) 204 temporarily stores data output from the memory cell array 201 or data input into the memory cell array 201.

The source line driver 205 controls the electric potential of a source line in the memory cell array 201.

A well driver may be disposed in the plane 200-0 depending on the internal configuration of the memory cell array. The well driver can control the electric potential of a well in the memory cell array 201.

Memory Cell Array

Figure 4:
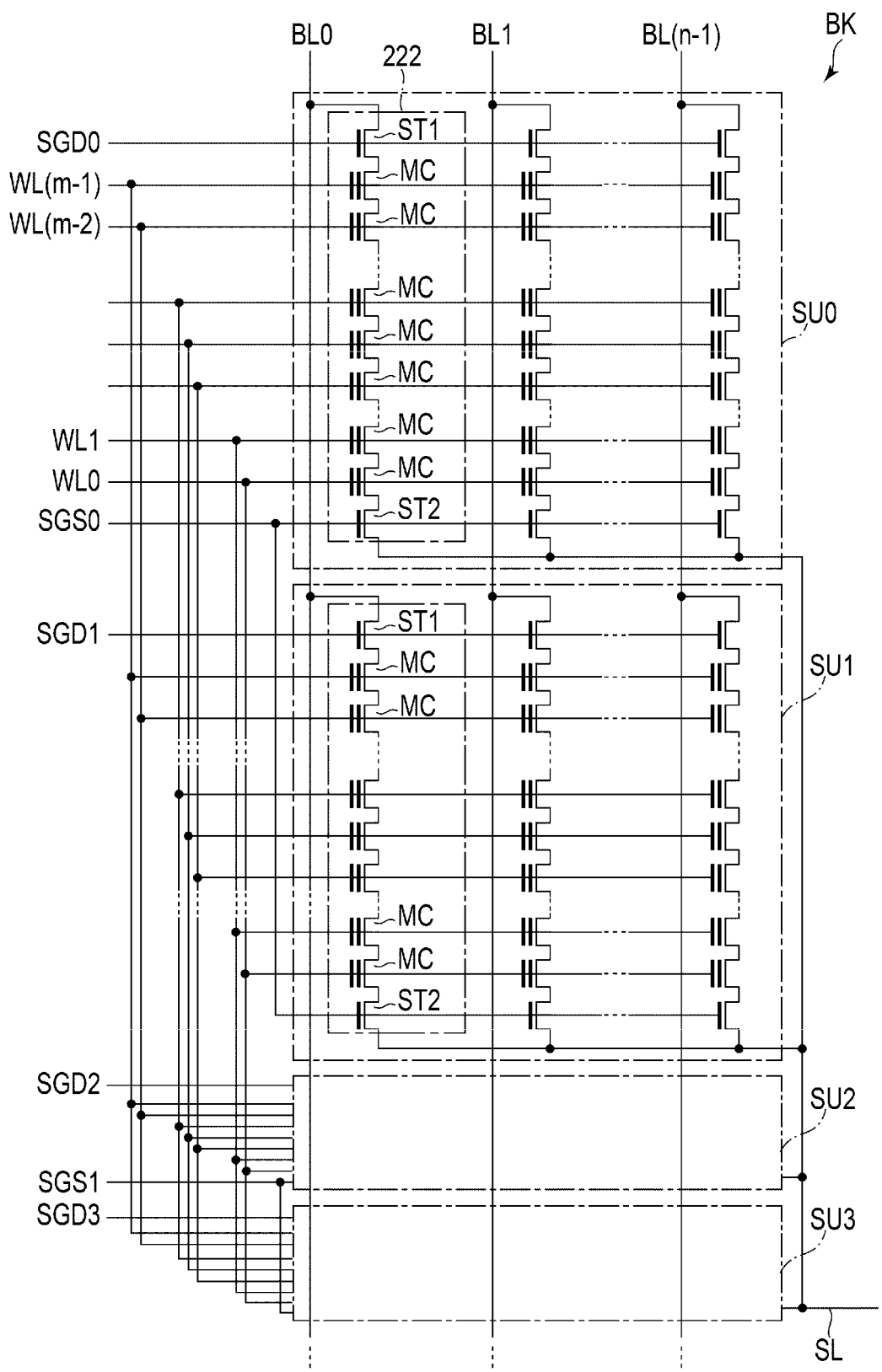
FIG. 4 is an equivalent circuit diagram of the semiconductor memory of the first embodiment.

FIG. 4 is a diagram for describing a configuration example of the memory cell array in the semiconductor memory of the present embodiment.

In FIG. 4, one block is extracted and illustrated.

As illustrated in FIG. 4, for example, one block BK includes four string units SU (SU0 to SU3).

Each NAND string 222 includes a plurality of memory cells MC and select transistors ST1 and ST2.

Each memory cell (also referred to as memory cell transistor) MC includes a control gate and a charge storage layer (also referred to as a memory film). In each NAND string 222, the plurality of memory cells MC are connected in series between the select transistors ST1 and ST2. Among the plurality of memory cells connected in series, one end (source/drain) of the memory cell MC on the drain side of the NAND string 222 is connected to one end (source/drain) of the select transistor ST1. One end of the memory cell MC on the source side of the NAND string 222 is connected to one end of the select transistor ST2.

A plurality of drain side select gate lines SGD0 to SGD3 are connected to the gates of the select transistors ST1 of the plurality of string units SU0 to SU3, respectively. The plurality of select gate lines SGD are independent of each other for each of the string units SU0 to SU3.

A source side select gate line SGS (SGS0 and SGS1) is connected to the gate of the select transistor ST2 in common across the plurality of string units SU.

For example, one select gate line SGS is shared by two string units SU. In this case, two source side select gate lines SGS0 and SGS1 are disposed in one block BK.

Four source side select gate lines SGS may be disposed in one block BK. In this case, an independent select gate line is disposed for each string unit. One source side select gate line SGS may be disposed in one block BK. In this case, one source side select gate line SGS is connected to all string units SU in the block BK.

Word lines WL0 to WL(m-1) are connected to the control gates of the memory cells MC of the plurality of string units SU. The number m is a natural number greater than or equal to one.

A plurality of memory cells MC of different string units SU are connected to one of the plurality of word lines WL in common.

In the memory cell array 201, the other end (source/drain) of each select transistor ST1 of the NAND strings 222 in the same column among the NAND strings 222 arranged in a matrix configuration is connected to one bit line of a plurality of bit lines BL (BL0 to BL(n-1)) in common. For example, the bit lines BL are connected to the NAND strings 222 in common across the plurality of blocks BK. The number n is a natural number greater than or equal to one.

The other end (source/drain) of the select transistor ST2 is connected to a source line SL.

Data is read and written in a batched manner in the plurality of memory cells MC that are connected in common to one word line WL selected from the plurality of word lines WL in the selected string unit SU in the selected block BK. The unit of reading and writing data is referred to as a page.

For example, the memory cell array 201 has a three dimensional structure. In the present embodiment, for example, a structure, operation, and a manufacturing method for the memory cell array having a three dimensional structure may employ configurations disclosed in U. S. patent application Ser. No. 12/407,403, entitled "THREE DIMENSIONAL STACKED NONVOLATILE SEMICONDUCTOR MEMORY" and filed on Mar. 19, 2009, U.S. patent application Ser. No. 12/406,524, entitled "THREE DIMENSIONAL STACKED NONVOLATILE SEMICONDUCTOR MEMORY" and filed on Mar. 18, 2009, U.S. patent application Ser. No. 12/679,991, entitled "NON-VOLATILE SEMICONDUCTOR STORAGE DEVICE AND METHOD OF MANUFACTURING THE SAME" and filed on Mar. 25, 2010, and U.S. patent application Ser. No. 12/532,030, entitled "SEMICONDUCTOR MEMORY AND METHOD FOR MANUFACTURING SAME" and filed on Mar. 23, 2009. The entire contents of these patent applications are incorporated by reference herein.

In the semiconductor memory of the present embodiment, the memory cell array 201 may have a two dimensional structure. In the memory cell array 201 having a two dimensional structure, the memory cells MC are arranged in a matrix configuration along the surface of a semiconductor substrate. In the memory cell array having a two dimensional structure, the control gate and the charge storage layer of each memory cell are stacked in a direction perpendicular to the surface of the semiconductor substrate.

(a-4) Sequence Control Circuit

Figure 5:
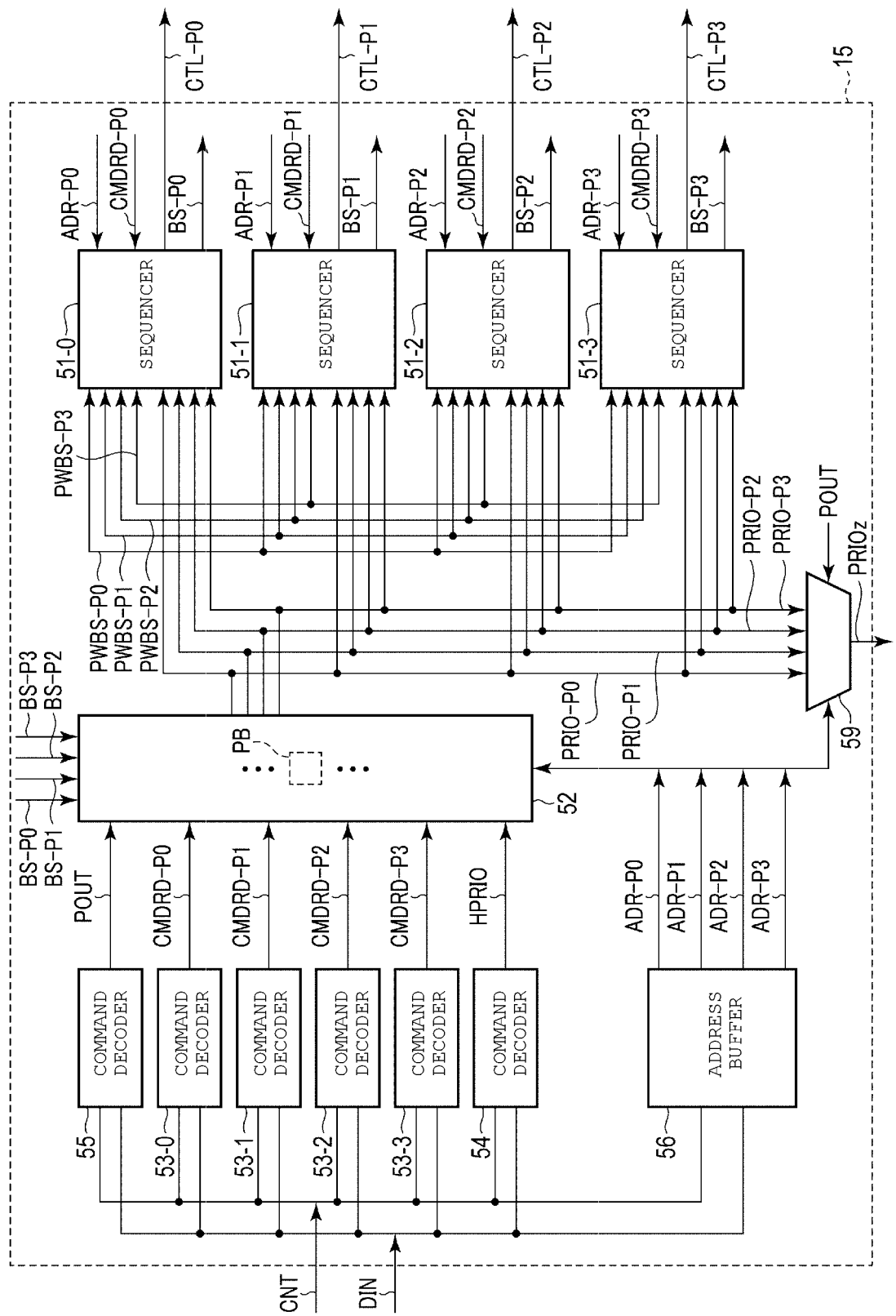
FIG. 5 is a block diagram of a sequence control circuit in the semiconductor memory of the first embodiment.

FIG. 5 is a block diagram illustrating a configuration example of the sequence control circuit in the semiconductor memory of the present embodiment.

As illustrated in FIG. 5, the sequence control circuit 15 includes a plurality of sequencers 51 (51-0, 51-1, 51-2, and 51-3), a priority control circuit 52, a plurality of command decoders 53 (53-0, 53-1, 53-2, 53-3, and 53-4), 54, and 55, an address buffer 56, a multiplexer 59, and the like.

For example, the plane common control circuit 159 in FIG. includes the priority control circuit 52, the command decoders 54 and 55, the address buffer 56, and the multiplexer 59.

For example, the first plane control circuit 150-0 in FIG. 2 includes the sequencer 51-0 and the command decoder 53-0. The second plane control circuit 150-1 includes the sequencer 51-1 and the command decoder 53-1. The third plane control circuit 150-2 includes the sequencer 51-2 and the command decoder 53-2. The fourth plane control circuit 150-3 includes the sequencer 51-3 and the command decoder 53-3.

Each sequencer 51 controls the operation of the corresponding plane 200.

Each sequencer 51 output the core control signal CTL (CTL-P0, CTL-P1, CTL-P2, and CTL-P3) in order to control the operations of the planes 200. The core control signal CTL is generated and controlled using various signals supplied to each sequencer 51.

Each sequencer 51 outputs an internal busy signal BS (BS-P0, BS-P1, BS-P2, and BS-P3) depending on the operating status of the corresponding plane 200.

The internal busy signal BS is input into the priority control circuit 52.

The internal busy signal BS is one type of internal state signal of the semiconductor memory 1.

The internal busy signal BS is a signal that indicates whether or not each plane is in operation. When the signal level (logical state) of the internal busy signal BS is equal to the level "H", the internal busy signal BS indicates that the operation of the plane 200 is in execution.

In the plurality of sequencers 51, a signal PWBS (PWBS-P0, PWBS-P1, PWBS-P2, and PWBS-P3) is input and output among the sequencers 51.

The signal PWBS is a signal that indicates that arbitration of the operations of the planes 200 is to be executed (or a signal that indicates a period for executing arbitration of the operations of the planes 200) depending on the operating status of the plane in operation. Hereinafter, the signal PWBS will be referred to as an arbitration signal.

When the signal level of the arbitration signal PWBS is equal to the level "H", the signal PWBS indicates that arbitration of operation among the planes 200 is performed.

Details of the arbitration signal PWBS will be described later.

A command CMD as the signal DIN is supplied to each command decoder 53.

Each command decoder 53 interprets (and decodes) the command CMD such as a read command and a write command. For example, the read command is a command signal that provides an instruction to execute the read operation. The write command is a command signal that provides an instruction to execute the write operation. For example, the command may include a signal that indicates an operation target plane.

Each command decoder 53 outputs the interpretation result of the command CMD as a signal CMDRD to the priority control circuit 52. Each command decoder 53 supplies the signal CMDRD to the priority control circuit 52 (priority storing circuit PB) and the corresponding sequencer 51.

For example, each command decoder 53 can identify whether the signal DIN is the command CMD, an address ADR, or data DT based on the input control signal CNT.

Each command decoder 53 can determine whether or not the supplied command CMD is a command for the corresponding plane 200 using the control signal CNT and the signal (for example, at least one of the command CMD or the address ADR) DIN. Accordingly, each command decoder 53 can appropriately interpret the supplied command CMD and generate the signal CMDRD for the plane 200 indicated by the address ADR.

Hereinafter, the signal CMDRD that is acquired by the interpretation of the command by the command decoders 53 and 54 will be referred to as a decoded command or a decoded signal.

The command decoder 54 interprets (and decodes) the supplied command. The command decoder 54 outputs the interpretation result of the command as a signal HPRIO to the priority control circuit 52. The signal HPRIO in an activated state is a signal that indicates that the priority of the operation to be executed based on the command CMD is set to the highest value.

The command decoder 55 interprets (and decodes) the supplied command. The command decoder 55 outputs the interpretation result of the command as a signal POUT to the priority control circuit 52. The signal POUT in the activated state is a signal that indicates that a priority signal, described later, is output to the memory controller 5.

The address buffer 56 interprets (and decodes) the address ADR. The address ADR indicates the unit of selection in the plane. For example, the address ADR includes a plane address, a block address, a page address, and the like. The address buffer 56 supplies the address ADR (or the interpretation result of the address ADR) to the sequencers 51, the priority control circuit 52, and the multiplexer 59.

The priority control circuit 52 generates the priority signal PRIO (PRIO-P0, PRIO-P1, PRIO-P2, and PRIO-P3) using the internal busy signal BS, the interpretation result CMDRD of the command, the address (the decoding result of the address) ADR, and the like.

The priority control circuit 52 outputs the priority signal PRIO (PRIO-P0, PRIO-P1, PRIO-P2 and PRIO-P3) to the sequencers 51. The priority signal PRIO is a signal that indicates the priority order (priority) of the operation of each plane 200. The priority control circuit 52 can control the operations of the sequencers 51 using the priority signal PRIG.

The priority control circuit 52 includes a plurality of the priority storing circuits PB (PB0, PB1, PB2, and PB3). For example, the plurality of priority storing circuits PB are provided in one-to-one correspondence with the plurality of planes 200 (and the sequencers 51).

Each priority storing circuit PB can store and control the priority signal PRIG of the corresponding plane 200.

The multiplexer 59 is activated based on the signal POUT. The multiplexer 59 can output, as a signal PRIOz, one priority signal that corresponds to the address ADR among the priority signals PRIG-P0 to PRIO-P3 corresponding to the planes 200.

For example, the internal busy signal BS can be output to the outside of the control circuit 15. In this case, the internal busy signal BS corresponding to each plane 200 is supplied to the multiplexer 59. The multiplexer 59 can select one of the plurality of internal busy signals BS based on the address ADR (for example, the plane address).

Accordingly, the selected internal busy signal BS is output from the multiplexer 59. Consequently, the sequence control circuit 15 can notify other circuits (for example, the memory controller 5) of the operating states of the planes 200.

The internal busy signal BS (or a signal generated from the internal busy signal) is transmitted to the controller 5 via the terminal RBnx.

For example, the controller 5 can detect which plane is executing the read operation using the internal busy signal BS. Accordingly, for the plane 200 for which the read operation is finished, the controller 5 can detect the plane 200 from which data can be read (or the plane for which a new command can be transmitted) based on the detection result of the internal busy signal BS.

As will be described below, the semiconductor memory of the present embodiment can control and arbitrate the operation timings of the plurality of planes using the priority set for the operation of each plane and the arbitration signal indicating the operating status of the planes.

(a-5) Priority Storing Circuit and Priority

The priority control circuit and the priority storing circuits of the semiconductor memory of the present embodiment will be described with reference to FIG. 6 to FIG. 8.

Basic Configuration

Figure 6:
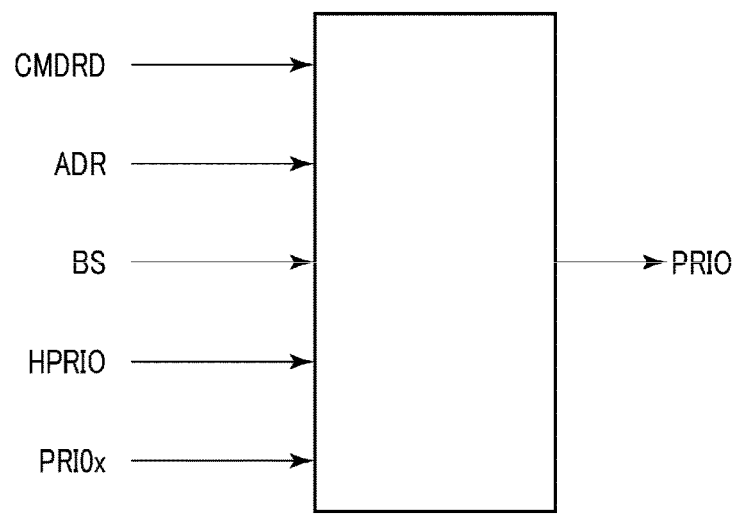
FIG. 6 is a diagram illustrating inputs to a priority storing circuit in the semiconductor memory of the first embodiment.

FIG. 6 is a conceptual diagram for describing the priority storing circuits of the semiconductor memory of the present embodiment.

One priority storing circuit PB is illustrated in FIG. 6.

In the semiconductor memory of the present embodiment, the priority control circuit 52 includes the four priority storing circuits PB in correspondence with the four planes 200.

In the semiconductor memory of the present embodiment, each priority storing circuit PB can generate and store a priority (priority signal) for arbitrating the operations of the plurality of planes 200. The priority is a value that indicates the priority order of the operation of each plane 200.

In the present embodiment, the priority (priority order) of the operations of the planes 200 is determined using a plurality of signals (hereinafter, referred to as internal state signals) related to the internal state of the semiconductor memory 1 (the operating status of the planes 200) that is based on the signals and the like from the controller 5.

For example, as illustrated in FIG. 6, at least the command CMD (or the decoding result of the command), the high priority command HPRIO, the address ADR, and the internal busy signal BS are supplied to the priority storing circuit PB. Additionally, a priority signal PRIOx of another priority storing circuit (and the priority storing circuit PB) may be supplied to the priority storing circuit PB.

The priority storing circuit PB sets the value of the priority of operation based on the supplied signals and the value of the priority stored by the priority storing circuit PB.

The priority storing circuit PB outputs the priority having the set value as the priority signal PRIG to the corresponding sequencer 51 and the multiplexer 59.

The priority storing circuit PB continues holding the priority signal PRIG having the set value until the operating status of the planes 200 changes, or until a change in priority is requested from the outside of the semiconductor memory.

For example, the value of the priority signal is set depending on the input order of the command.

The value of the priority signal PRIG for the operation (or operation command) that is correlated with the signal HPRIO can be set to a high value based on the signal HPRIO.

Configuration Example

Figure 7:
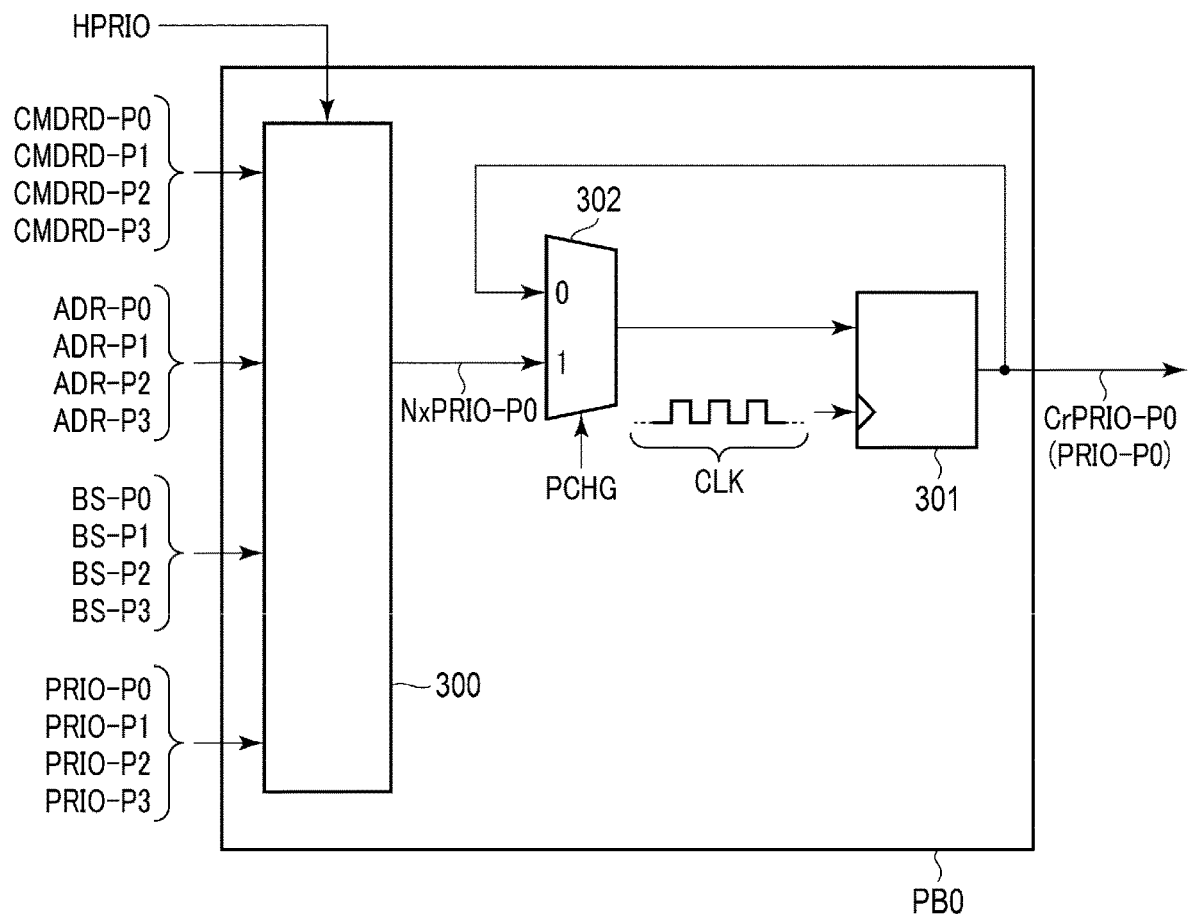
FIG. 7 is a block diagram of the priority storing circuit in the semiconductor memory of the first embodiment.

FIG. 7 is a diagram for describing a configuration example of each priority storing circuit in the priority control circuit of the semiconductor memory of the present embodiment.

A configuration example of the priority storing circuit corresponding to one plane (for example, the first plane 200-0) is illustrated in FIG. 7. The priority storing circuit corresponding to each plane has substantially the same configuration as the circuit configuration in FIG. 7.

In the example illustrated in FIG. 7, the priority storing circuit PB includes a calculation circuit 300, a holding circuit 301, and a selection circuit 302.

The signals CMDRD, ADR, and BS that are related to the operating status of all planes 200 (here, four planes) in the semiconductor memory 1 are supplied to one priority storing circuit PB that corresponds to one plane 200.

For example, the calculation circuit 300 receives various signals based on the command, the address, and the internal state signals.

The calculation circuit 300 receives the signal CMDRD (CMDRD-P0 to CMDRD-P3) from the command decoders 53. The calculation circuit 300 receives the address ADR (ADR-P0 to ADR-P3) from the address buffer 56. The calculation circuit 300 receives the internal busy signal BS (BS-P0, BS-P1, BS-P2, and BS-P3) from the sequencers 51. The priority signal PRIG (PRIG-P0, PRIO-P1, PRIO-P2, and PRIG-P3) of each of the corresponding priority storing circuit PB0 and the other priority storing circuits PB1, PB2, and PB3 is supplied to the calculation circuit 300.

For example, the signal CMDRD is a signal that corresponds to the decoding result of the read command. The command supplied to the calculation circuit 300 is not limited to the read command. A command (for example, the write command) other than the read command is supplied to the calculation circuit 300 depending on the requested operation.

In the priority storing circuit PB0 of the plane 200-0, the calculation circuit 300 generates a signal NxPRIO-P0 based on the supplied plurality of signals CMDRD, ADR, BS, and PRIG. The signal NxPRIO-P0 is a signal that indicates the priority order to be given next to the corresponding plane. The operating status of the plane 200-0 corresponding to the priority storing circuit PB0 and the operating status of the other planes 200-1 to 200-3 are reflected on the value of the signal NxPRIO-P0. In the present embodiment, the signal NxPRIO is referred to as an update signal or an update value.

For example, in FIG. 7, signals related to the plurality of planes 200 are supplied to the calculation circuit 300 of one priority storing circuit. Only signals related to the plane corresponding to the priority storing circuit may be supplied to the calculation circuit 300. The calculation circuit 300 may be shared by the plurality of priority storing circuits as a component of the priority control circuit 52.

In the priority storing circuit PB0 of the plane 200-0, the holding circuit 301 stores a current priority (priority signal) CrPRIO-P0 (PRIO-P0). For example, the holding circuit 301 is a register. Hereinafter, the holding circuit 301 will be referred to as the register 301. For example, the register 301 is configured with a flip-flop.

The register 301 receives signals from the selection circuit 302. The register 301 temporarily stores the received signals. For example, a clock signal CLK is supplied to the control terminal of the register 301. The register 301 acquires the supplied signal in synchronization with the timing of the clock signal CLK.

The selection circuit (hereinafter, referred to as a selector) 302 is connected between the calculation circuit 300 and the register 301.

One input terminal (input port) of the selector 302 is connected to the output terminal (output port) of the calculation circuit 300. The other input terminal of the selector 302 is connected to the output terminal of the register 301. The output terminal of the selector 302 is connected to the input terminal of the register 301.

A signal PCHG (which is a switch signal) that is generated inside the sequence control circuit 15 (for example, the priority control circuit 52) is supplied as a control signal to the selector 302. In response to the signal PCHG, the selector 302 selects one of the signal NxPRIO-P0 from the calculation circuit 300 or the signal CrPRIO-P0 from the register 301. The signal PCHG is a signal that is activated when the priority order (priority) of the operation of the corresponding plane is changed. The signal level of the signal PCHG is typically set to the level "L" (state "0"). The signal level of the signal PCHG is set to the level "H" (state "1") when the signal PCHG is activated.

For example, when the signal level of the signal PCHG is equal to the level "H", the selector 302 selects the signal NxPRIO-P0. When the signal level of the signal PCHG is equal to the level "L", the selector 302 selects the signal CrPRIO-P0.

The selector 302 outputs the selected signal to the register 301.

In the above configuration, the priority storing circuit PB outputs a value indicating the current priority (the priority order of the operations of the planes) in the register 301 as the priority signal PRIG-P0 to the plurality of sequencers 51 (and the multiplexer 59).

The configuration of the priority storing circuit PB is not limited to the example in FIG. 7 and may have other configurations. The priority storing circuit desirably has at least the following two configurations or functions.

The priority storing circuit PB can store the priority (priority order) CrPRIO of the current operation of the corresponding plane.

When a change in the operating states of the plurality of planes occurs, the priority storing circuit PB can change the priority (priority order) of the operation of the corresponding plane depending on the update value NxPRIO that is determined based on the states of the plurality of planes.

Priority

Figure 8:
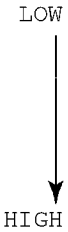
FIG. 8 is a diagram for describing different priorities that can be set in the semiconductor memory of the first embodiment.

FIG. 8 is a diagram for describing the priority (the priority order and the operating state) set for the operation of each plane in the semiconductor memory of the present embodiment.

In the semiconductor memory of the present embodiment, as illustrated in the example in FIG. 8, the priority storing circuit PB stores the priority (priority signal) having any one of values "0", "1", "2" and "3" depending on the priority order of the operations of the plurality of planes 200. Each plane 200 can have four operating states depending on the priority set for the corresponding priority storing circuit PB.

The priority illustrated as "3" indicates a state where the priority order of operation is the highest, and is referred to herein as first priority order. When arbitration of the operations of the plurality of planes 200 is executed, the operation of the plane that corresponds to the priority storing circuit storing the priority "3" is most preferentially executed at all times.

The priority illustrated as "2" indicates a state where the priority order of operation is the second highest after the priority "3", and is referred to herein as second priority order. When arbitration of the operations of the plurality of planes is executed, the operation of the plane that corresponds to the priority storing circuit storing the priority "2" is preferentially executed next to the operation of the plane corresponding to the priority storing circuit storing the priority "3".

The priority illustrated as "1" indicates a state where the priority order of operation is third, and is referred to herein as third priority order. When arbitration of the operations of the plurality of planes 200 is executed, the operation of the plane that corresponds to the priority storing circuit storing the priority "1" is preferentially executed next to the operation of the plane corresponding to the priority storing circuit storing the priority "2".

The priority illustrated as "0" indicates a state where the priority order of operation is the lowest, and is referred to herein as fourth priority order. For example, the priority "0" indicates the initial state of the operation of the plane (a state where an operation is not started), a state where the plane is performing an operation that can be executed without arbitration, or a state after the operation of the plane is finished. When arbitration of the operations of the plurality of planes is executed, the operation of the plane that corresponds to the priority storing circuit storing the priority "0" is executed last in order.

For example, the operation having the priority "3" is not hindered by the operations having the priorities "0" to "2". The operation having the priority "2" is controlled not to hinder the operation having the priority "3". The operation having the priority "2" is not hindered by the operations having the priorities "1" and "0". The operation having the priority "1" is controlled not to hinder the operations having the priorities "3" and "2". The operation having the priority "1" is not hindered by the operation of the plane having the priority "0". The operation having the priority "0" is controlled not to hinder the operations having the other priorities.

For example, a high priority is set for the operation of the plane that corresponds to types of packets (or commands) for an interruption routine process and a data process of a host device.

Command Protocol

FIGS. 9A and 9B are diagrams illustrating a command sequence in the semiconductor memory of the present embodiment.

FIG. 9A illustrates a command sequence of the read command of the semiconductor memory.

As illustrated in FIG. 9A, when the read operation is executed for a plane of the semiconductor memory 1, a signal "00$h$" and a signal "30$h$" are transmitted as the command CMD (CMDa and CMDb) to the semiconductor memory from the memory controller. The signals "00$h$" and "30$h$" indicate the type of operation to be executed and the start of the operation.

The address ADR includes address signals A1, A2, A3, A4, and A5 that correspond to five cycles. The address signals A1 to A5 indicate the plane address, the block address, the column address, the page address, and the like of the operation target.

The command CMD and the address ADR are supplied to the semiconductor memory 1 via the I/O terminals IOx<7:0>.

Information (suffix) that indicates the plane of the operation target may be added to the command CMD.

FIG. 9B illustrates a command sequence that is used in the memory system and the semiconductor memory of the present embodiment.

As illustrated in FIG. 9B, in the present embodiment, the memory controller 5 transmits a special command ("xxh" in FIG. 9B) CMDx before transmitting the command CMD indicating the operation and the selected address ADR in order to cause the semiconductor memory 1 to preferentially execute the commanded operation.

The special command CMDx is output to the I/O terminals IOx<7:0> from the memory controller 5. After the special command CMDx, the command CMDa, the address ADR, and the command CMDb are output in this order to the I/O terminals IOx<7:0> from the memory controller 5.

In such a manner, the command signal CMDx is transmitted before the command signal CMDa of "00$h$" in the present embodiment.

The special command CMDx indicates that the operation of the command pertaining to the command CMDx is most preferentially executed.

Accordingly, unlike the command sequence in FIG. 9A, the command sequence including the command CMDx can indicate to the semiconductor memory 1 that the commanded operation is the operation having a high priority (for example, the operation to be executed most preferentially).

Hereinafter, the command CMDx will be referred to as the high priority command (or the high priority command signal) CMDx.

The semiconductor memory 1 receives the high priority command CMDx, the command CMDa, the address ADR, and the command CMDb.

The high priority command CMDx is interpreted by the command decoder 54. The interpretation result of the high priority command CMDx is supplied as the signal HPRIO to the priority control circuit 52. The calculation circuit 300 performs a calculation process using the signal HPRIO.

When the high priority command CMDx is activated, each priority storing circuit PB sets a priority such that the operation of the command CMD (CMDa and CMDb) for the address ADR pertaining to the high priority command CMDx is preferentially executed.

Output of Priority

An output operation for the priority in the semiconductor memory and the memory system of the present embodiment will be described with reference to FIG. 10A and FIG. 10B.

Figure 10A:
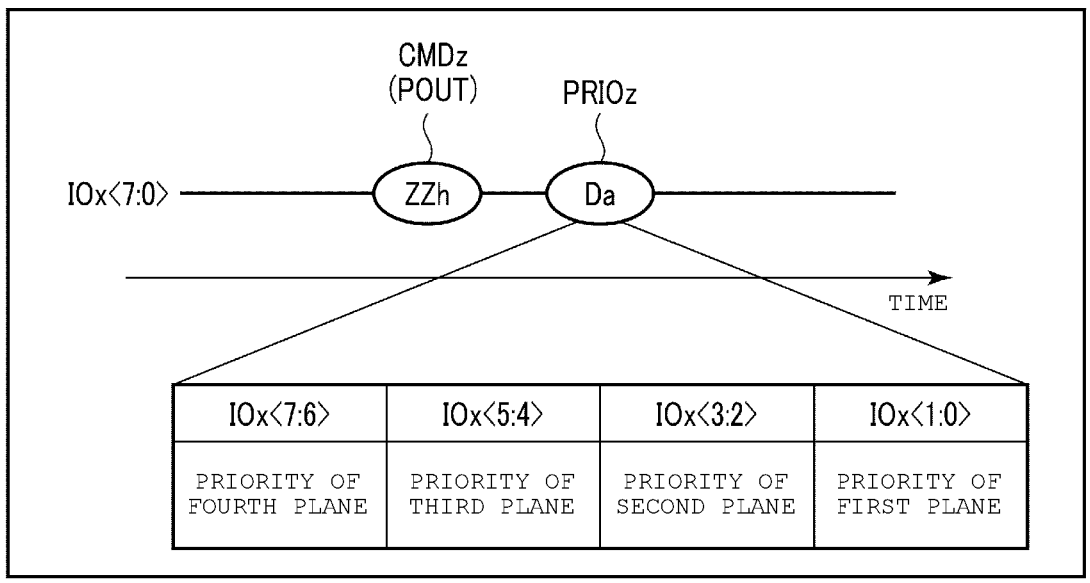
FIGS. 10A, 10B, and 10C are each a diagram illustrating a command sequence for outputting priority used in the semiconductor memory of the first embodiment.

FIG. 10A is a diagram for describing a command sequence for outputting priority that is used in the semiconductor memory and the memory system of the present embodiment.

In FIG. 10A, a command ("ZZh" in FIG. 10A) CMDz is a command for outputting the priority of the operation of each plane 200 of the semiconductor memory 1.

In the present embodiment, for example, the memory controller 5 issues the command (hereinafter, referred to as the priority output command) CMDz in order to detect the priority of the operation of each plane 200 of the semiconductor memory.

When the semiconductor memory 1 receives the command CMDz, the semiconductor memory 1 outputs the current priority (priority signal) PRIG of the operation of each plane 200 to the memory controller 5 as a response to the command CMDz. The semiconductor memory 1 outputs the current priority related to the operations of all planes 200 based on the command CMDz.

For example, the semiconductor memory 1 executes the following internal process based on the command CMDz.

In the semiconductor memory 1, the command decoder 55 illustrated in FIG. 5 interprets the command CMDz. The control signal POUT is activated based on the interpretation result of the command CMDz.

The semiconductor memory 1 outputs the priority signal PRIG corresponding to each plane 200 as the signal PRIOz based on the activated control signal POUT.

For example, after the read enable signal REnx is set to the level "L", the output signal PRIOz is output to the controller 5 via the output buffer circuit 103 and the I/O terminals IOx<7:0> in FIG. 2.

In such a manner, the command CMDz causes the semiconductor memory 1 to transmit the priority signal PRIOz ("Da" in FIG. 10A) of the operation executed by the planes 200 to the memory controller 5.

For example, in the data (signal) Da corresponding to the priority signal PRIOz on the I/O terminals (I/O lines) IOx<7:0>, data of two bits of the I/O terminals IOx<7:6> indicates the priority of the operation of the fourth plane 200-3. Data of two bits of the I/O terminals IOx<5:4> indicates the priority of the operation of the third plane 200-2. Data of two bits of the I/O terminals IOx<3:2> indicates the priority of the operation of the second plane 200-1. Data of two bits of the I/O terminals IOx<1:0> indicates the priority of the operation of the first plane 200-0.

Accordingly, the memory controller 5 can acquire the priority of each plane 200 corresponding to the internal operating status of the semiconductor memory 1.

The priority signal PRIOz (signal Da) is output in correspondence with the command CMDz. However, the present embodiment is not limited to a case where signals are output physically at the same time. That is, a slight interval may be present among the output timings of the I/O terminals IOx. That is, the point is that the output timings of the signals from the I/O terminals IOx overlap with each other.

Figure 10B:
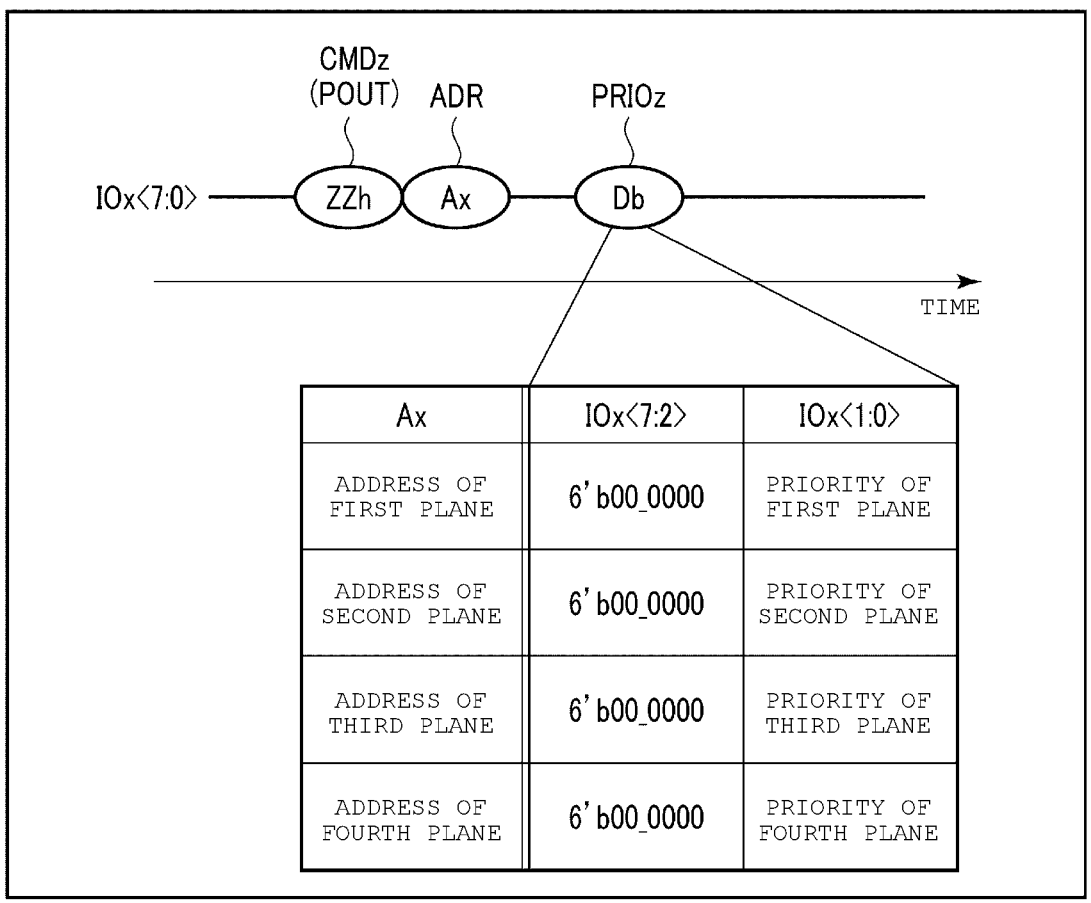

FIG. 10B is a diagram illustrating a modification example of FIG. 10A.

In order to detect the priority of operation related to a specific plane 200, the address may be transmitted to the semiconductor memory 1 from the memory controller 5 along with the priority output command.

As illustrated in FIG. 10B, the memory controller 5 transmits the address ADR ("Ax" in FIG. 10B) of at least one plane 200 to the semiconductor memory 1 from the memory controller 5 after the priority output command CMDz.

The semiconductor memory 1 outputs the current priority of the operation of the plane 200 indicated by the address ADR as the signal PRIOz ("Db" in FIG. 10B) to the memory controller 5 via the I/O terminals IOx<7:0>.

For example, in the data (signal) Db corresponding to the priority signal PRIOz on the I/O terminals (I/O lines) IOx<7:0>, data of two bits of the I/O terminals IOx<1:0> indicates the priority of the operation of the selected plane 200. Data of six bits of the I/O lines IOx<7:2> is illustrated as data "6′b00_0000" (data "000000").

In such a manner, the memory controller 5 is notified of the priority of operation related to the selected plane 200 from the semiconductor memory 1.

Figure 10C:
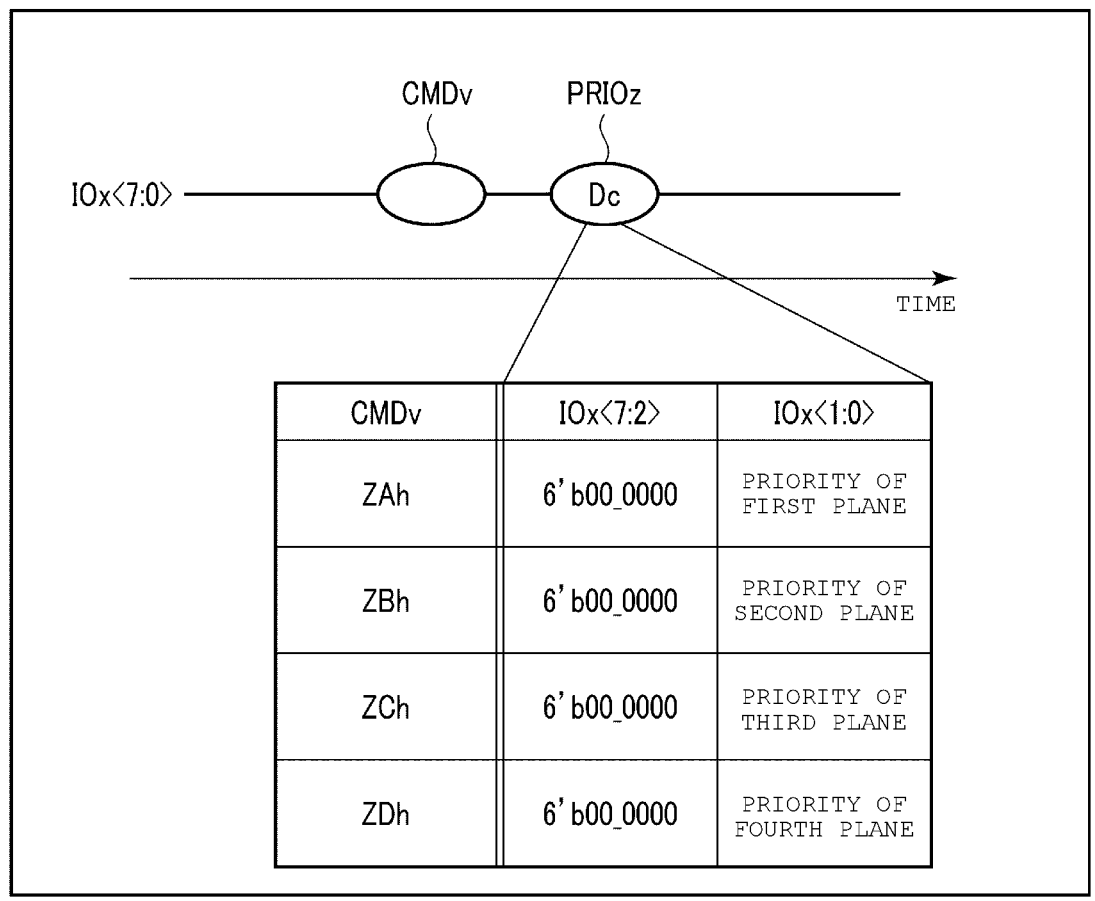

FIG. 10C is a diagram illustrating an example different from FIG. 10A and FIG. 10B.

As illustrated in FIG. 10C, the memory controller 5 may be notified of the priority of operation related to the selected plane 200 from the semiconductor memory 1 using a different command (code) for each plane 200.

For example, a signal (code) "ZAh" is set as a command CMDv for outputting the priority of the operation of the first plane 200-0. A signal "ZBh" is set as the command CMDv for outputting the priority of the operation of the second plane 200-1. A signal "ZCh" is set as the command CMDv for outputting the priority of the operation of the third plane 200-2. A signal "ZDh" is set as the command CMDv for outputting the priority of the operation of the fourth plane 200-3.

The signals ZAh, ZBh, ZCh, and ZDh are different from each other.

In accordance with the signals ZAh, ZBh, ZCh, and ZDh, the memory controller 5 is notified of the priorities of the planes 200 corresponding to the signals ZAh, ZBh, ZCh, and ZDh from the semiconductor memory 1 via the I/O terminals IOx<7:0>.

For example, for each of the signal codes ZAh, ZBh, ZCh, and ZDh, in signal Dc corresponding to the priority signal PRIOz on the I/O terminals IOx<7:0>, data of two bits of the I/O lines IOx<1:0> indicates the priority of the operation of the selected plane 200. Data of six bits of the I/O terminals IOx<7:2> is illustrated as data "6′b00 0000".

In the semiconductor memory 1 of the present embodiment, the value (signals PRIG-P0 to PRIO-P3) of the priority stored in each priority storing circuit PB is changed by not only the command from the outside but also when the read operation in execution is finished.

By outputting the priority, the memory controller 5 can set an appropriate priority for the operation of the plane 200 that corresponds to the command and the address to be issued, depending on the internal operating status of the semiconductor memory 1.

Accordingly, the memory system and the semiconductor memory of the present embodiment can set a flexible priority order corresponding to the internal states of the planes of the semiconductor memory for the operation to be executed by the planes.

Arbitration Signal

As illustrated in FIG. 5, the arbitration signal PWBS (PWBS-P0, PWBS-P1, PWBS-P2, and PWBS-P3) are transmitted and received among the plurality of sequencers 51.

The signal PWBS is a signal that is used for arbitrating the operations of the plurality of planes. For example, the arbitration signal PWBS indicates a time period (timing) for executing arbitration.

When an operation (e.g., an internal process) that causes a load (for example, a current value, a current amount, or noise greater than or equal to a certain level) for the operation to be executed in the planes 200 is started, the arbitration signal PWBS is activated.

The signal level of the activated arbitration signal PWBS is set to the level "H".

For example, the signal level of the arbitration signal PWBS is controlled in correlation with a current consumption (or the amount of current consumption) in the planes 200. The signal level of the arbitration signal PWBS is set to the level "H" in correspondence with the start timing of the charging of the word lines WL or the start timing of the charging of the bit lines BL.

In this case, the length of a period in which the signal level of the arbitration signal PWBS is set to the level "H" corresponds to a period in which a current caused by the internal process occurs.

For example, the timing of activating/deactivating the arbitration signal PWBS-P0 is controlled based on the value (for example, the cumulative value of clocks from the start of operation) of a counter (not illustrated) from the start of the operation in the planes.

The timing of activating/deactivating the arbitration signal PWBS-P0 may be controlled based on the monitoring result of the sequencers 51 for the electric potential/current inside the planes 200.

The semiconductor memory of the present embodiment controls the order of operation of each plane 200 by arbitrating the operation of each plane 200 based on the arbitration signal PWBS and the priority signal PRIG.

The plurality of sequencers 51 monitor the arbitration signal PWBS of each sequencer 51.

When the timings of the arbitration signal PWBS at the level "H" overlap with each other with respect to the operations of the plurality of planes during the parallel operations of the plurality of planes, the sequencer 51 for which the priority of the operation of the corresponding plane 200 is low among the plurality of sequencers 51 sets the state of the operation of the plane to a wait state or a slow state. For example, in the present embodiment, the wait state means a state where the internal process/operation of the plane is held. In the present embodiment, the slow state means a state where the internal process/operation of the plane is performed at a slow speed.

Accordingly, for example, the sequencer for which the priority of the operation of the corresponding plane is high can control the operation of the plane at an operating speed of a basic setting such that the operation of the plane is preferentially executed.

In such a manner, in the semiconductor memory of the present embodiment, when there is a possibility that the timings of the load in the operations of the plurality of planes executed in parallel overlap with each other among the plurality of planes, each sequencer 51 executes arbitration among the operations of the plurality of planes in execution depending on the level of the priority and the arbitration signal PWBS set for the operation of each plane such that the operation having a high priority is preferentially executed over the operation having a low priority.

As described thus far, when there is a possibility that the load (for example, an excessive current and/or noise) caused by the operation of each plane occurs in the plurality of planes at the same time, the semiconductor memory of the present embodiment preferentially executes the operation of the plane having a high priority, and temporally shifts and executes the operation of the plane having a low priority based on the priority and the arbitration signal.

(c) Operating Example

An operating example of the semiconductor memory of the present embodiment will be described with reference to FIG. 11 to FIG. 20. In the following description, the operation executed by each plane is the read operation for illustrative purposes. However, the operation executed by each plane may be an operation other than the read operation such as the write operation or an erase operation.

Example 1

Example 1 of the operating example of the semiconductor memory of the present embodiment will be described with reference to FIG. 11 to FIG. 14.

Figure 11:
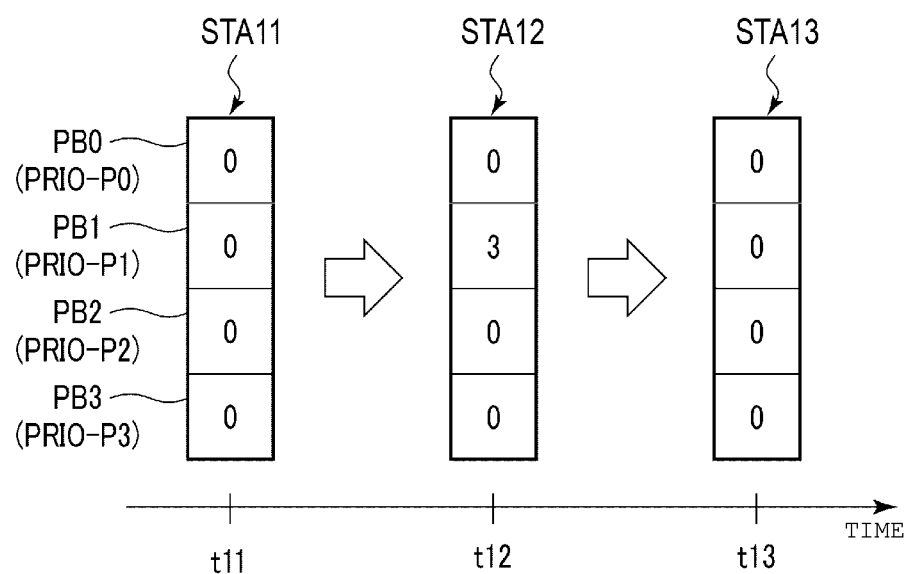
FIG. 11 is a diagram for describing an operation example of the semiconductor memory of the first embodiment.

FIG. 11 is a diagram for describing the state of each priority storing circuit during the operation of the semiconductor memory in the present embodiment.

A horizontal axis in FIG. 11 corresponds to time. In FIG. 11, a change in the state (priority signals PRIG-P0 to PRIO-P3) of each priority storing circuit depending on the operating status of the planes is illustrated.

Figure 12:
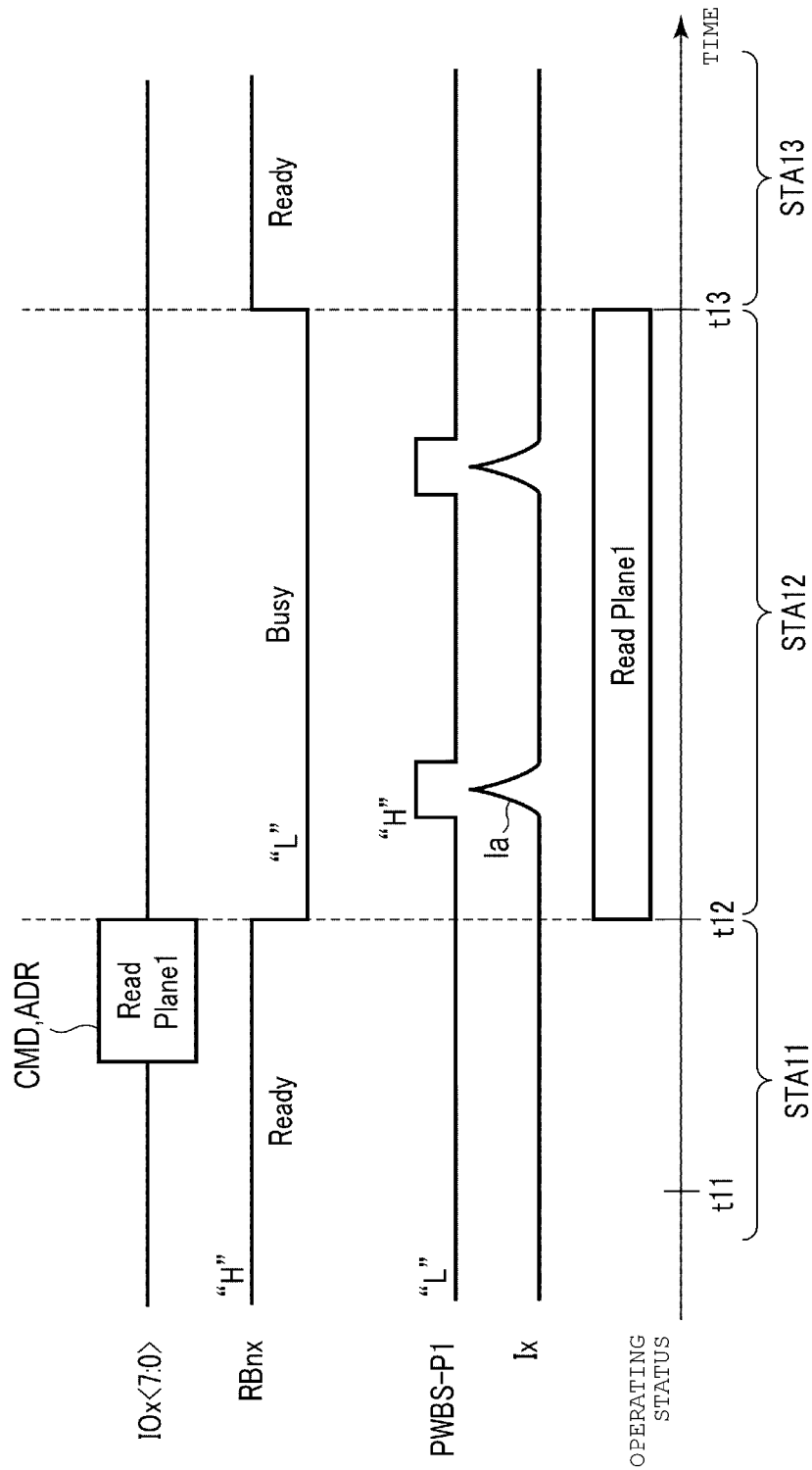
FIG. 12 is a timing chart for describing changes in various signals during an operation performed on one of multiple planes of the semiconductor memory of the first embodiment.

FIG. 12 is a timing chart for describing a change in various signals with respect to the operating status of the semiconductor memory of the present embodiment.

A horizontal axis in FIG. 12 corresponds to time. In FIG. 12, the signal levels of the I/O signals IOx, the signal level of the ready/busy signal RBnx, the signal level of the arbitration signal PWBS, the operating status of the planes, and a current Ix flowing in the semiconductor memory are illustrated.

The operating example illustrated in FIG. 11 and FIG. 12 illustrates an example in which a predetermined operation is executed for only one plane among the four planes.

The example in FIG. 11 and FIG. 12 illustrates an example in which the second plane 200-1 executes an operation (for example, the read operation) corresponding to the command alone. In the present example, since the operation is performed by a single plane, arbitration of the operation of the second plane 200-1 and the operations of the other planes is not executed.

Hereinafter, control of the operation of the plane in the present example will be more specifically described.

Time t11

A state STA11 at time t11 in FIG. 11 and FIG. 12 is a state before the operation of the semiconductor memory 1 is started. In the state STA11, the operation of each plane 200 in the semiconductor memory 1 is not executed.

Thus, as illustrated in FIG. 11, the values of the priority signals PRIG-P0 to PRIO-P3 of the priority storing circuits PB corresponding to the planes 200 are set to "0". The semiconductor memory 1 is in a state where the priority order of the operations of all planes 200 is not set.

As illustrated in FIG. 12, in the state STA11, since the operation of the semiconductor memory is not started, the logical state (signal level) of the ready/busy signal RBnx is set to the state "H".

Time t12

After time t11, for example, the memory controller 5 issues the command CMD. For example, the issued command CMD and the address ADR are based on the command sequence illustrated in FIG. 9A.

The command CMD and the address ADR are transmitted to the semiconductor memory 1 from the memory controller 5.

As illustrated in FIG. 12, the memory controller 5 outputs the command CMD and the address ADR as the I/O signals to the I/O terminals IOx<7:0>.

For example, when the memory controller 5 transmits the command CMD and the address ADR, the ready/busy signal RBnx is at the level "H". The ready/busy signal RBnx at the level "H" indicates to the memory controller 5 that the operation of each plane of the semiconductor memory 1 is not executed.

The semiconductor memory 1 receives the data of the command CMD and the address ADR on the I/O terminals IOx<7:0>. Accordingly, the semiconductor memory 1 starts the operation.

At time t12, the semiconductor memory 1 starts the operation indicated by the command CMD for the selected area indicated by the address ADR.

The command CMD as the signal DIN is input into the command decoders 53 of the sequence control circuit 15 via the input buffer circuit 102. The command decoders 53 decode the command CMD. The command decoders 53 output the decoding result (decoded signal) CMDRD of the command CMD to the priority control circuit 52 (priority storing circuits PB) and the sequencers 51.

The address ADR is input into the address buffer 56 of the sequence control circuit 15 via the input buffer circuit 102. For example, the address buffer 56 buffers (and decodes) the address ADR. The address buffer 56 outputs the address (the decoding result of the address) ADR to the priority control circuit 52, the sequencers 51, and the multiplexer 59. Accordingly, each sequencer 51 can recognize whether or not the plane 200 to which the sequencer 51 corresponds is the operation target.

The address ADR as the signal DIN is input into the command decoders 53. Accordingly, each command decoder 53 can recognize whether or not the plane 200 to which the command decoder 53 corresponds is the operation target.

In the priority control circuit 52, each priority storing circuit PB sets the priority of each plane 200 using a plurality of supplied signals.

Accordingly, the state of each plane 200 of the semiconductor memory 1 is changed to a state STA12 from the state STA11.

For example, as in the state STA12 of each priority storing circuit PB at time t12, the values stored by the priority storing circuits PB indicate that the read operation of the second plane 200-1 is executed.

Figure 13:
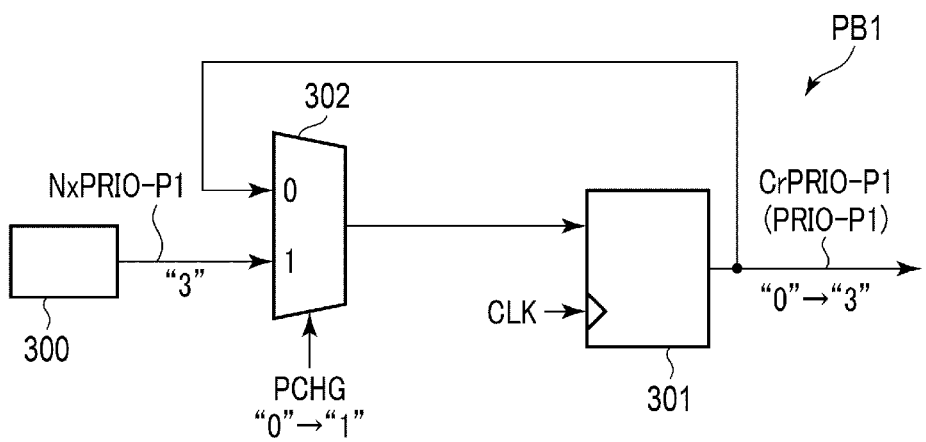
FIGS. 13 and 14 are each a diagram for describing a change in priority of an operation of a plane in the semiconductor memory of the first embodiment.

FIG. 13 is a diagram for describing a change in the priority of the operation of a plane when the semiconductor memory of the present embodiment operates.

In FIG. 13, a change in the operation and the state of the priority storing circuit when the state STA11 in FIG. 9 transitions to the state STA12 is schematically illustrated.

As illustrated in FIG. 13, in the priority storing circuit PB1 corresponding to the second plane 200-1, the register 301 stores the priority "0" as the current value (value in the initial state) CrPRIO-P1. The priority storing circuit PB outputs a signal corresponding to "0" as the priority signal PRIG-P1.

In a state where the priority signal PRIO-P1 is set to "0", when the semiconductor memory 1 receives the command CMD, the signal PCHG is activated. For example, the priority control circuit 52 changes the signal level of the signal PCHG of the priority storing circuit PB corresponding to the second plane 200-1 to "1" (level "H") from "0" (level "L").

The calculation circuit 300 performs the calculation process using the supplied signal CMDRD, the address ADR, the internal state signals (for example, the internal busy signal BS), and the priority signal PRIG.

For example, the command signal CMDRD-P1 and the address ADR-P1 corresponding to the second plane 200-1 are activated.

At this point, when the internal busy signals BS-P0 to BS-P3 of the planes 200 are in a deactivated state, the calculation circuit 300 determines the updated value of the signal NxPRIO-P1 corresponding to the second plane 200-1 based on a plurality of supplied signals such that the priority to be set after the value "0" for the second plane 200-1 is "3".

Accordingly, the value of the signal NxPRIO-P1 is set to "3".

The signal NxPRIO-P1 and the signal CrPRIO-P1 are supplied to the selector 302.

The signal PCHG of "1" causes the selector 302 to select the signal NxPRIO-P1 from the calculation circuit 300. The selector 302 outputs the selected signal NxPRIO-P1 to the register 301.

The register 301 acquires the signal NxPRIO-P1 at a timing based on the clock signal CLK.

Accordingly, the value of the priority stored in the register 301 is updated. The register 301 stores the value "3" as the signal CrPRIO-P1 (which represents the current value).

After the value of the register 301 is updated, the signal PCHG is deactivated. The signal level of the signal PCHG is changed to "0" from "1".

The register 301 outputs the priority signal PRIO-P1 of "3" to indicate that the priority of the operation is "3".

In such a manner, the priority order of the operation of the second plane 200-1 is updated. The priority signal PRIO-P1 of the second plane 200-1 is changed to "3" from "0".

The signals supplied to each priority storing circuit PB are the command and the address for the second plane 200-1. Accordingly, for the planes 200-0, 200-2, and 200-3 other than the second plane 200-1, the priority of the priority storing circuit corresponding to each of the planes 200-0, 200-2, and 200-3 is maintained at "0".

For example, for the planes 200-0, 200-2, and 200-3, the change signals PCHG of the priority storing circuits PB0, PB2, and PB3 are not deactivated when the priority of the operation of the second plane 200-1 is updated. The signal PCHG at the level "0" causes the selector 302 to select the signal CrPRIO from the register 301.

Accordingly, in the priority storing circuits PB of the planes 200-0, 200-2, and 200-3, the value of the register 301 is continuously stored at the current value (here, "0"). The register 301 outputs the priority signal PRIG of "0".

In the priority storing circuits PB of the planes 200-0, 200-2, and 200-3 that do not execute operations, the calculation result of the calculation circuit 300 is acquired as a value based on the state of the operation of each plane. Accordingly, even when the change signal PCHG is activated, the priority of the priority storing circuit PB of each of the planes P0, P2 and P3 that do not execute operations is set to a value (here, "0") corresponding to the operating state of each of the planes P0, P2, and P3.

As a result of setting the priority, the operation of the second plane 200-1 is started based on the command CMD and the address ADR.

As illustrated in FIG. 12, along with the start of the read operation of the second plane 200-1, the sequence control circuit 15 changes the state of the ready/busy signal RBnx to the level "L" from the level "H".

Each sequencer 51 controls the operation of the corresponding plane 200 based on the signal CMDRD, the address ADR, and the priority signal PRIG. Each sequencer 51 supplies the control signal CTL to the plane 200 in order to control the operation of the plane 200.

The control signal CTL-P1 from the sequencer 51-1 causes the second plane 200-1 to execute the read operation. Meanwhile, the sequencers 51-0, 51-2, and 51-3 set the other planes 200-0, 200-2, and 200-3 to a non-operating state.

When the read operation of the second plane 200-1 is performed, the bit lines BL are charged in order to sense the currents (or the electric potentials) of the bit lines BL. When the read operation is performed, the word lines WL are charged in order to activate the selected cell.

The charging of the word lines WL and the bit lines BL causes a current Ia in the plane 200-1. The sequencer 51-1 changes the signal level of the arbitration signal PWBS to the level "H" from the level "L" at a timing (or the timing of the current flow) when a process/operation for which the amount of current consumption caused by charging the interconnections becomes larger than or equal to a certain threshold.

The sequencer 51-1 outputs the arbitration signal PWBS at the level "H".

The sequencer 51-1 changes the signal level of the arbitration signal PWBS-P1 to the level "L" from the level "H" at a timing when the process/operation that causes a current higher than or equal to the threshold is finished. Accordingly, the sequencer 51-1 outputs the arbitration signal PWBS-P1 at the level "L".

For example, at the timing of charging the bit lines BL (for example, time to in FIG. 12), the sequencer 51-1 causes the signal level of the arbitration signal PWBS-P1 to transition to the level "H" from the level "L". At a timing when the charging of the bit lines BL is complete, the sequencer 51-1 causes the signal level of the arbitration signal PWBS-P1 to transition to the level "L" from the level "H".

At the timing of activating the word lines WL (for example, time tb in FIG. 12), the sequencer 51-1 causes the signal level of the arbitration signal PWBS-P1 to transition to the level "H" from the level "L". Then, at the timing of deactivating the word lines WL, the sequencer 51-1 causes the signal level of the arbitration signal PWBS-P1 to transition to the level "L" from the level "H".

When the charging of the bit lines BL and the activation of the word lines are executed a plurality of times while data is read once, the activation of the arbitration signal PWBS may be executed three times or more.

By the read operation of the second plane 200-1, data at the selected address (selected page) in the memory cell array 201 is read.

The read data is transmitted to the memory controller 5 from the semiconductor memory 1 at a certain timing. For example, when the data is transmitted, the semiconductor memory 1 can notify the controller 5 of the plane 200 from which data can be read among the plurality of planes (or the plane 200 for which the command can be issued), via the terminal RBnx using the internal busy signal BS (or a signal generated from the internal busy signal BS).

Time t13

At time t13, the state of each plane 200 transitions to a state STA13 from the state STA12. The state STA13 is a state where the operation of the plane is finished.

When the read operation of the second plane 200-1 is complete, the state of each plane 200 is changed to the state STA13 from the state STA12 between time t12 and time t13.

Figure 14:
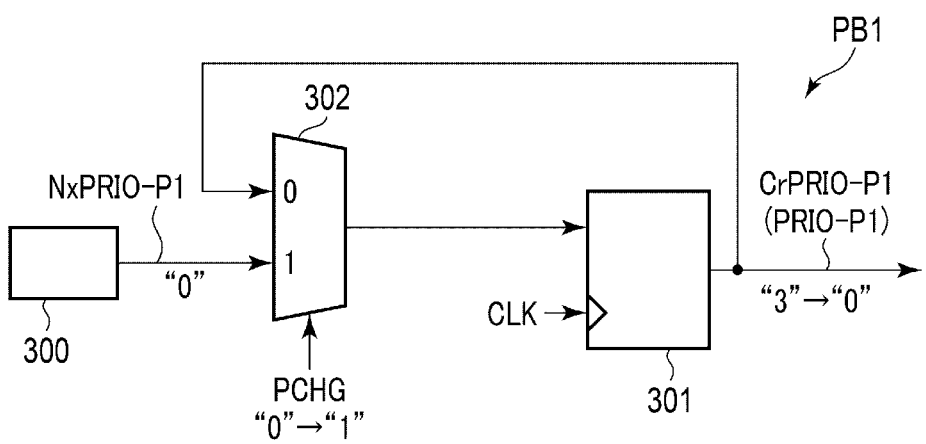

FIG. 14 is a diagram for describing a change in the priority of the operation of a plane when the semiconductor memory of the present embodiment operates.

In FIG. 14, a change in the operation and the state of the priority storing circuit when the state STA12 in FIG. 11 transitions to the state STA13 is schematically illustrated.

When the read operation of the second plane 200-1 is complete, the signal level of the internal busy signal BS-P1 of the second plane 200-1 transitions to the level "L" from the level "H".

The calculation circuit 300 sets the value of the update signal NxPRIO-P1 to "0" based on a plurality of supplied signals.

For example, the priority storing circuit PB1 detects a change in the internal busy signal BS-P1 of the second plane 200-1 to the deactivated state ("0") from the activated state ("1") with respect to the command CMDRD-P1 and the address ADR-P1 in the activated state. The internal busy signal BS-P1 in the deactivated state is supplied to the calculation circuit 300. The calculation circuit 300 executes the calculation process using the internal busy signal BS-P1.

In this case, the updated value of the priority NxPRIO-P1 that is to be set next for the second plane 200-1 is determined as "0" based on the calculation result of the calculation circuit 300.

As illustrated in FIG. 14, when the read operation of the second plane 200-1 for which the priority signal PRIO-P1 is in the state "3" is complete, the change signal PCHG is activated by the priority control circuit 52. Accordingly, the change signal PCHG is changed to "1" from "0".

The selector 302 selects the signal NxPRIO-P1 based on the signal PCHG of "1". Accordingly, the selector 302 outputs the signal NxPRIO-P1 of "0" to the register 301.

The register 301 acquires the selected signal NxPRIO-P1 at a timing based on the clock signal CLK. Accordingly, the value of the priority stored by the register 301 is updated to a value corresponding to the signal NxPRIO-P1.

Consequently, the value of the priority CrPRIO-P1 of the operation of the second plane is set to "0".

In such a manner, the priority order of the operation of the second plane 200-1 is changed when the operation of the second plane 200-1 is complete.

Accordingly, the value of the priority of each of the priority storing circuits PB becomes "0".

When the operation of the selected plane is complete, the signal level (logical state) of the ready/busy signal RBnx is changed to the level "H" from the level "L".

As described thus far, the operation of a single plane in the semiconductor memory of the present embodiment is complete.

In the present embodiment, the content of each plane in the states STA11 to STA13 during the operation of the semiconductor memory can be output at any time using at least one of the plurality of methods in FIG. 10A to FIG. 10C.

In the example in FIG. 11 to FIG. 14, the read operation is executed in only one plane. Thus, arbitration between the read operation of the selected plane and the operations of the other planes is not executed. However, the signal PWBS related to arbitration of operation is output regardless of the number of planes executing operations at the same time (in parallel).

In the semiconductor memory of the present embodiment, the signal PWBS related to arbitration of operation may not be output (the signal level of the signal PWBS may be maintained at the level "L") when execution of the read operation in only one plane is detected based on the internal busy signal BS, and the signal PWBS related to arbitration of operation may be output when execution of the read operation in two or more planes is detected based on the internal busy signal BS.

Example 2

An operating example of the semiconductor memory of the present embodiment will be described with reference to FIG. 15 to FIG. 20.

Figure 15:
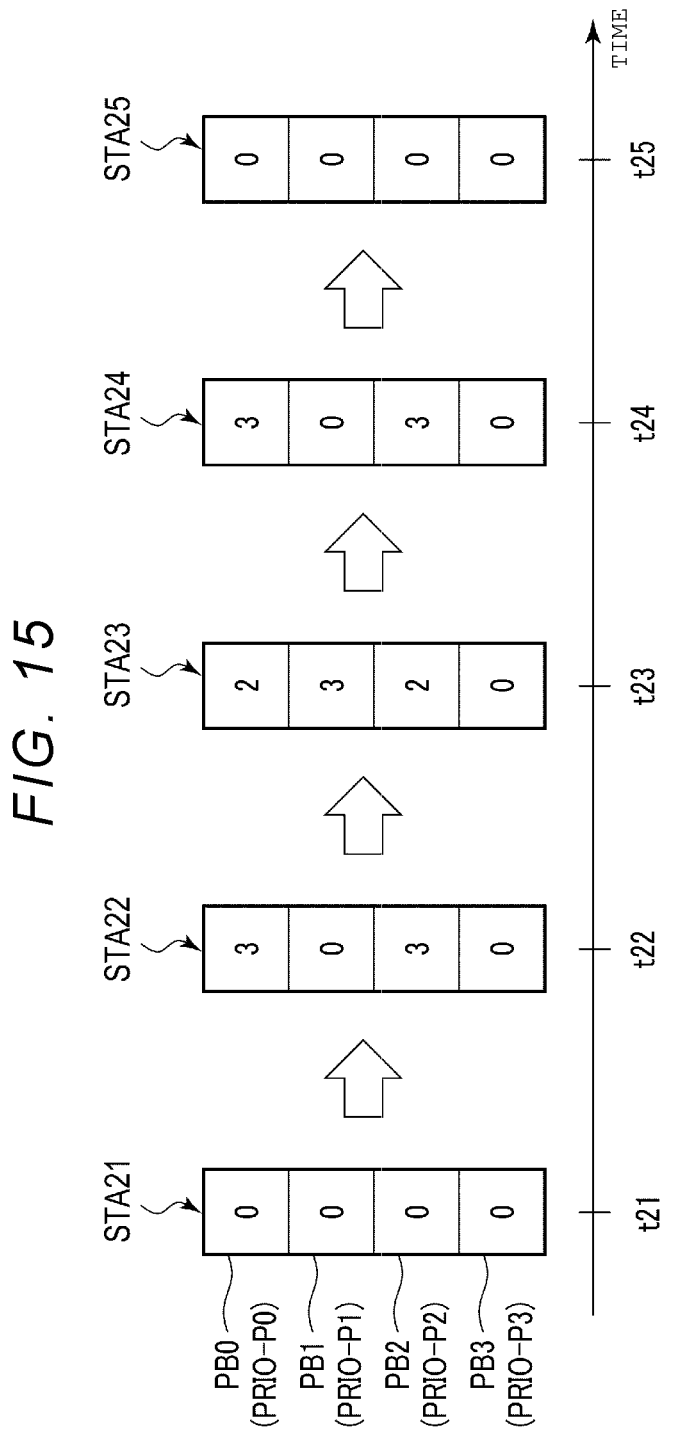
FIG. 15 is a diagram for describing an operation example of the semiconductor memory of the first embodiment.

FIG. 15 is a diagram for describing a change in the priority of the operation of each of the plurality of planes in Example 2 of the operating example of the semiconductor memory of the present embodiment.

In Example 2 illustrated in FIG. 15, a case where arbitration of operation among the planes occurs due to the operations of the plurality of planes performed at the same time will be described. In the present example, the operations of the planes are started at different timings.

Figure 16:
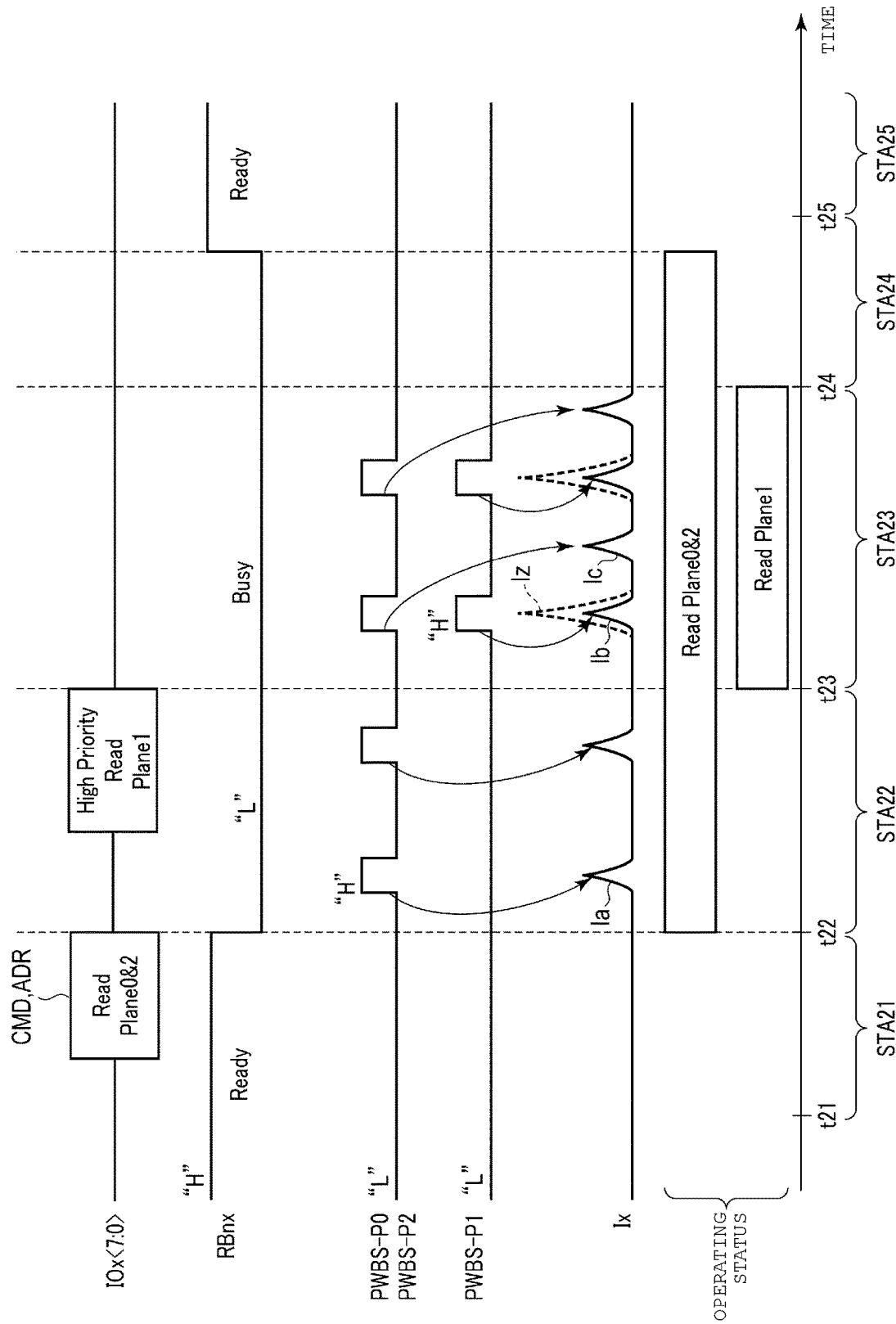
FIG. 16 is a timing chart for describing changes in various signals during operation of the semiconductor memory of the first embodiment.

FIG. 16 is a timing chart for describing a change in various signals with respect to the operating status of the semiconductor memory of the present embodiment. A horizontal axis in FIG. 16 corresponds to time. In FIG. 16, the I/O signals IOx, the ready/busy signal RBnx, the arbitration signal PWBS, and the current Ix are illustrated.

A brief summary of the operation of each plane of the semiconductor memory in the present example is as follows.

When the read operation is performed for two known planes at the same time (multiplane read), the first plane 200-0 and the third plane 200-2 start the read operation at the same time.

Then, the second plane 200-1 starts the read operation at a certain timing during the execution of the preceding read operations of the planes 200-0 and 200-2. Among the plurality of read operations executed in parallel, the read operation of the second plane 200-1 that is started last is executed with the highest priority.

After the read operation of the second plane 200-1 is finished first, the read operation of the first plane 200-0 and the read operation of the third plane 200-2 are finished.

Hereinafter, control of the operations of the plurality of planes using the priority and the arbitration signal will be more specifically described.

Time t21

As illustrated in FIG. 15, at time t21, the states of the plurality of planes are set to a state STA21.

The state STA21 is a state before the operation of each plane is started. The state of the priority signal PRIG of the priority storing circuit PB in each of the planes 200 is set to "0" (initial state).

In such a manner, the state of the priority signal PRIG of each plane 200 indicates a state where the read operation of each plane is not started.

Time t22

At time t22, the state of the priority storing circuit PB of each plane 200 is changed to a state STA22 from the state STA21.

A change in the state (priority) of the priority storing circuit of each plane occurs due to the reception of the command CMD in the semiconductor memory 1.

As illustrated in FIG. 16, at time t22, the memory controller 5 outputs the command and the address as the I/O signals to the I/O terminals IOx<7:0>.

For example, based on the known multiplane read operation, the memory controller 5 transmits the command and the address for the first plane 200-0, and the command and the address for the third plane 200-2 in this order as the I/O signals to the semiconductor memory 1. The semiconductor memory 1 receives the command CMD and the address ADR for the first plane 200-0, and the command CMD and the address ADR for the third plane 200-2.

Accordingly, the operations of the planes 200-0 and 200-2 are started. In the multiplane read, the start timing of the read is the same in the first plane 200-0 and the third plane 200-2.

In the same manner as Example 1, in each priority storing circuit PB, the calculation circuit 300 executes the calculation process using various supplied signals in order to set the priority of the operation of the corresponding plane. Accordingly, the priority of the operation of each plane is set.

Figure 17:
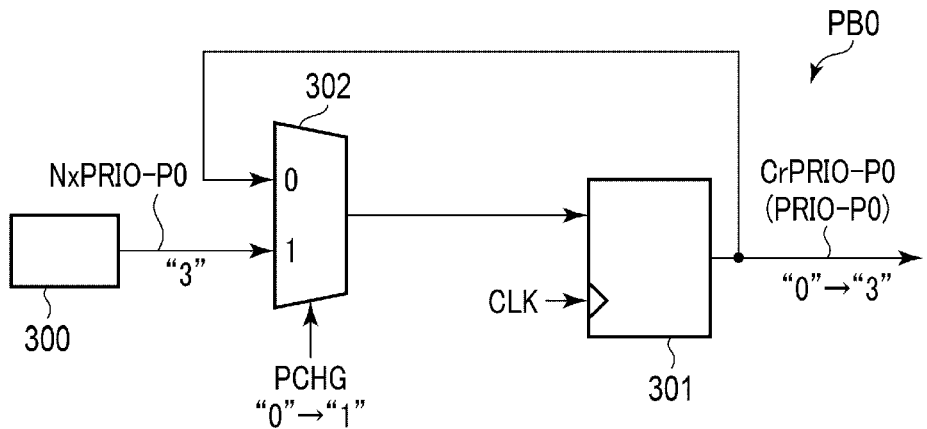
FIGS. 17-20 are each a diagram for describing a change in priority of an operation of a plane in the semiconductor memory of the first embodiment.

FIG. 17 is a diagram for describing a change in the priority of the operation of a plane when the semiconductor memory of the present embodiment operates.

In FIG. 17, a change in the operation and the state of the priority storing circuit when the state STA21 in FIG. 15 transitions to the state STA22 is schematically illustrated.

As illustrated in FIG. 17, in the priority storing circuit PB0 corresponding to the first plane 200-0, the calculation circuit 300 outputs the update signal NxPRIO-P0 of "3" based on the calculation result.

The change signal PCHG of "1" causes the selector 302 to output the update signal NxPRIO-P0 to the register 301.

The register 301 acquires the signal NxPRIO-P0 at the timing of the clock signal CLK. The register 301 stores the signal NxPRIO-P0 as a new current priority. Accordingly, the value CrPRIO-P0 stored by the register 301 is changed to "3" from "0".

The register 301 outputs the priority signal PRIG-P0 of "3".

The setting of the priority of the operation of the third plane 200-2 is substantially the same as the setting of the priority of the first plane 200-0. The priority storing circuit PB corresponding to the third plane 200-2 is caused to store the priority "3" by the same operation as the operation described using FIG. 17.

The priority storing circuits PB corresponding to the second plane 200-1 and the fourth plane 200-3 continue storing the priority signal "0" based on the calculation result.

Consequently, the read operations in the first and third planes 200-0 and 200-2 are started.

At time t22, the signal level of the signal RBnx is changed to the level "L" from the level "H".

In such a manner, the operations of the plurality of planes (here, the read operations of two planes) are started at the same time (in parallel).

Time t23

As illustrated in FIG. 15, at time t23, the priority storing circuit PB of each plane 200 is changed to a state STA23 from the state STA22.

As illustrated in FIG. 16, in the present example, while an operation for a certain plane is performed (during a period in which the ready/busy signal RBnx is at the level "L"), commands for the other planes are issued by the controller 5.

At time t23 during a period in which the ready/busy signal RBnx is at the level "L", the memory controller 5 transmits the commands CMDx, CMDa, and CMDb and the address ADR to the semiconductor memory 1 based on the command sequence in FIG. 10B.

The special command (high priority command) CMDx is added to the commands CMDa and CMDb that indicate the operations to be executed.

In the semiconductor memory 1, based on the high priority command signal CMDx, the sequence control circuit 15 controls the operation of each circuit such that the operation of the command CMD is preferentially executed for an area in the plane indicated by the address ADR.

Accordingly, the states of the priority storing circuits PB of the semiconductor memory 1 are changed to the state STA23 from the state STA22 such that the priority of the operation of the plane corresponding to the high priority command CMDx is increased.

In addition to the plurality of signals PRIG, CMDRD, BS, and ADR, the signal HPRIO corresponding to the high priority command CMDx causes the value of the priority of the priority storing circuit PB2 corresponding to the second plane 200-1 to be set to "3" that indicates the highest priority.

At the same time, the priority of the read operation of each of the planes 200-0 and 200-2 that are already executing operations with a first priority (priority "3") is decreased.

As a specific example of control for changing the priority, each priority storing circuit PB changes the value of the stored priority as follows.

Figure 18:
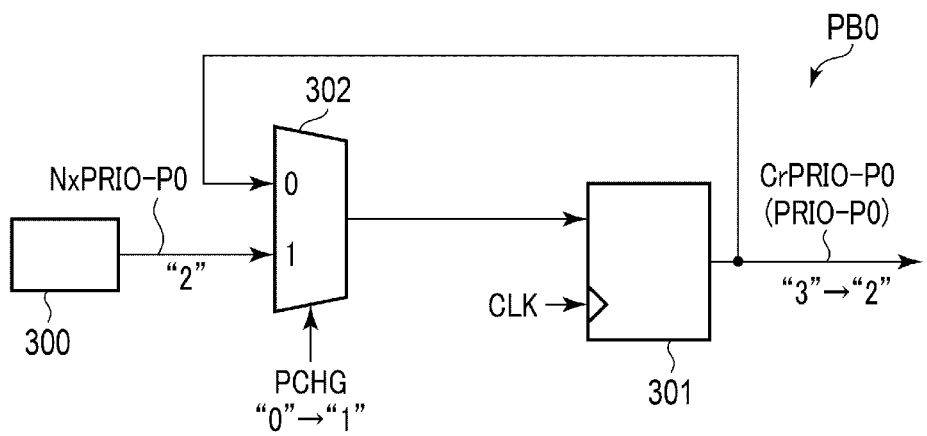

FIG. 18 is a diagram for describing a change in the priority of the operation of a plane when the semiconductor memory of the present embodiment operates. In FIG. 18, a change in the operation and the state of the priority storing circuit when the state STA22 in FIG. 15 transitions to the state STA23 is schematically illustrated.

In the example illustrated in FIG. 18, in the priority storing circuit PB0 of the first plane 200-0, when the command sequence including the high priority command CMDx and other internal signals are supplied, the calculation circuit 300 calculates the update signal NxPRIO-P0 again.

The priority storing circuit PB0 of the first plane 200-0 recognizes that the signal CMDRD-P1 and the address ADR are activated. The priority storing circuit PB0 recognizes that the internal busy signals BS-P0 and BS-P2 are activated. The priority storing circuit PB0 recognizes that the signal HPRIO (high priority command CMDx) is activated.

In addition, the priority signal (current priority) PRIG of each of the corresponding plane 200-0 and the other planes 200-1, 200-2, and 200-3 is supplied to the calculation circuit 300.

In the priority storing circuit PB0, the calculation circuit 300 determines the value of the update signal NxPRIO-P0 as "2" based on the priority signal PRIG, the activated signal CMDRD-P1, the internal busy signals BS-P0 and BS-P2 in the busy state, and the signal HPRIO in the activated state.

The calculation circuit 300 outputs the update signal NxPRIO-P0 of "2" to the selector 302.

The change signal PCHG of "1" causes the selector 302 to output the update signal NxPRIO-P0 to the register 301.

The register 301 stores the update signal NxPRIO-P0. Accordingly, the value of the register 301 is decreased to "2" from "3".

In the priority storing circuit PB0 of the first plane 200-0, the register 301 outputs the priority signal PRIG-P0 corresponding to the value "2".

In the priority storing circuit PB2 of the third plane 200-2, the value of the priority signal PRIO-P2 is decreased to "2" from "3" by substantially the same operation as the operation illustrated in FIG. 18.

In the priority storing circuits PB0 and PB2 corresponding to the planes 200-0 and 200-2, the values of the priority signals PRIG-P0 and PRIO-P2 are set to "2" that indicates the second highest priority.

In such a manner, along with the input of the high priority command CMDx, for example, the priority storing circuit PB of the plane that does not correspond to the high priority command decreases the value of the stored priority by one.

Accordingly, the priority of the read operation of each of the planes 200-0 and 200-2 is set to a second priority.

In the priority storing circuit PB1 corresponding to the second plane 200-1, the calculation circuit 300 determines the value of the update signal NxPRIO-P1 as "3" based on the signal HPRIO corresponding to the high priority command CMDx and other signals CMDRD-P1, ADR, BS, and PRIG. The calculation circuit 300 supplies the update signal NxPRIO-P1 of "3" to the register 301 via the selector 302.

The value stored in the register 301 is changed to "3" from "0" by an operation similar to the example described using FIG. 13. Accordingly, in the priority storing circuit PB1, the register 301 stores the priority signal CrPRIO-P1 of "3" on which the high priority command CMDx (signal HPRIO) is reflected.

In the priority storing circuit PB1 of the second plane 200-1, the register 301 outputs the priority signal PRIO-P1 corresponding to the value "3".

In such a manner, the read operation of the second plane 200-1 is set as an operation having the first priority.

As described thus far, in the present embodiment, the priority of the operation of each plane 200 is controlled such that the operation of the second plane 200-1 can be most preferentially executed.

The sequencers 51 control the operations of the corresponding planes 200 based on the set priority. The planes 200 execute predetermined operations under control of the sequencers 51. The operations of the planes 200 cause a load in the planes 200.

For example, a period in which the current consumption is instantaneously increased during the read operation may be present in the semiconductor memory 1. When the read operation is performed, the word lines WL and the bit lines BL in the selected plane 200-1 are charged. There is a possibility that the charging of the word lines WL and the charging of the bit lines BL increase the current consumption in the planes 200.

In the semiconductor memory of the present embodiment, each sequencer 51 activates the arbitration signal PWBS at a timing when there is a possibility that the load (current consumption and/or noise) of the corresponding plane 200 is increased. Each sequencer 51 outputs the activated signal (for example, the signal at the level "H") PWBS. The arbitration signal PWBS is input and output among the sequencers 51.

The plurality of priority signals PRIG and the plurality of arbitration signals PWBS cause the sequencers 51 to control the operations of the corresponding planes. Accordingly, each sequencer 51 determines whether to continue or hold the operation of the corresponding plane.

In the period of the state STA23 (the period from time t23 to time t24), the read operation of the second plane 200-1 is executed. The read operation of the plane 200-1 is started after the read operations of the first and third planes 200-0 and 200-2 are started.

The priority of the read operation of the plane 200-1 is set to a higher value than the priority of the operation of each of the planes 200-0 and 200-2.

For example, during the period of the state STA23, the sequencer 51-1 corresponding to the second plane 200-1 activates the arbitration signal PWBS-P1 at a timing when control for charging the word lines or the bit lines is started. The sequencer 51-1 changes the signal level of the arbitration signal PWBS-P1 to the level "H" from the level "L".

The sequencer 51-1 supplies the arbitration signal PWBS-P1 at the level "H" to the sequencers 51-0, 51-2, and 51-3 corresponding to the other planes 200-0, 200-2, and 200-3. Accordingly, in each sequencer 51, arbitration of the operation of the second plane 200-1 and the operations of the other planes is determined and executed.

Hereinafter, control of the parallel operations of the plurality of planes based on the priority will be more specifically described.

For example, in the first plane 200-0, the arbitration signal PWBS-P0 is coincidentally activated at the same timing as the activation of the signal PWBS-P1. Accordingly, the signal PWBS-P0 at the level "H" is supplied to the plurality of sequencers 51.

During the operations, the priority of the priority storing circuit PB1 is set to "3" (first priority) for the operation of the second plane 200-1, and the priority of the priority storing circuit PB2 is set to "2" (second priority) for the operation of the first plane 200-0.

The sequencer 51-1 corresponding to the second plane 200-1 detects the arbitration signal PWBS-P0 at the level "H". From the output of each priority storing circuit PB, the sequencer 51-1 recognizes that the priority of the operation of the plane 200-0 corresponding to the arbitration signal PWBS-P0 at the level "H" is lower than the priority of the operation of the plane 200-1 related to the sequencer 51-1.

Accordingly, the sequencer 51-1 executes the read operation of the second plane 200-1 without holding or delaying the operation.

A current Ib as the current consumption Ix of the semiconductor memory is caused by the charging of the word lines/bit lines in the second plane 200-1.

The sequencer 51-1 causes the signal level of the arbitration signal PWBS-P1 to transition to the level "L" from the level "H" at a timing when the charging of the word lines/bit lines in the second plane 200-1 is complete.

Meanwhile, the sequencer 51-0 corresponding to the first plane 200-0 detects the activated arbitration signal PWBS-P1 from the sequencer 51-1 corresponding to the plane 200-1 having a high priority ("3"). The value of the priority signal PRIG-P0 of the operation of the first plane 200-0 is lower than the value of the priority signal PRIO-P1 of the operation of the second plane 200-1.

Accordingly, when the sequencer 51-0 determines that there is a possibility of overlap between the timing of charging the interconnections in the corresponding first plane 200-0 and the timing of charging the interconnections in the second plane 200-1, the sequencer 51-0 temporarily stops the read operation of the first plane 200-0 or decreases the operating speed of the first plane 200-0.

The sequencer 51-0 detects the transition of the arbitration signal PWBS-P1 to the level "L" from the level "H", and charges the word lines/bit lines in the first plane 200-0. The charging of the word lines/bit lines in the first plane 200-0 causes a current Ic.

The timing of the current Ic flow in the first plane 200-0 is shifted to be later than the timing of the current Ib flow in the second plane 200-1.

Consequently, in the operations of the plurality of planes 200 that are executed in parallel, the operation of the plane 200-1 having a high priority is executed earlier than the operation of the plane 200-0 having a low priority.

As described thus far, controlling the timing of the internal process for the operation of each plane based on the arbitration of the priority distributes the timings of loads (for example, currents) in the planes.

For example, like the read operation of the first or third plane 200-0 or 200-2 in the period of the state STA22 (the period from time t22 to time t23), when the arbitration signal PWBS in the read operation having the first priority is not activated (currents do not occur at the same time in the plurality of planes) during a period in which the operation of the plane 200-0 having the second priority is executed, the sequencers 51-1 and 51-3 control the operations of the planes 200-0 and 200-2 such that the operations of the corresponding planes 200-0 and 200-2 are continued.

Accordingly, in the period of the state STA22, the current Ia occurs at the timing of charging the interconnections in the operations of the planes 200-0 and 200-2 without a delay in the operations of the planes 200-0 and 200-2.

A current Iz that is illustrated by a broken line in FIG. 15, illustrates a current waveform when currents occur substantially at the same time in the plurality of planes. For example, when the current Ib and the current Ic occur at the same time, the current Iz as the current consumption Ix occurs in the semiconductor memory 1. The peak value of the current Iz is higher than the peak value of a single current (for example, the current Ib) of each plane.

As in the present embodiment, when the timings of currents in the plurality of planes are distributed, the peak value of the current consumption occurring in the semiconductor memory can be decreased.

Time t24

As illustrated in FIG. 15, when the read operation of the plane 200-1 corresponding to the priority "3" is finished, the state of the priority storing circuit PB of each plane 200 is changed to a state STA24 from the state STA23.

As will be described below, a change to the state STA24 from the state STA23 is caused by a change in the internal state signals of the semiconductor memory 1.

As in FIG. 14, for example, the state of the internal busy signal BS-P1 of the second plane 200-1 is changed to the deactivated state (level "L") from the activated state (level "H") along with the end of the read operation of the second plane 200-1.

The current priority signal PRIO-P1 of the priority storing circuit PB1 and the priority signals PRIG-P0, PRIO-P2, and PRIO-P3 from the other priority storing circuits PB0, PB2, and PB3 are supplied to the priority storing circuit PB1.

Accordingly, by the calculation process of the calculation circuit 300 using those signals, the priority storing circuit PB1 of the second plane 200-1 changes the value of the priority signal PRIO-P1 to "0" from "3".

In such a manner, like the priority storing circuit PB1, each priority storing circuit PB can flexibly set the priority to be stored by the priority storing circuit PB while monitoring the setting status of the priority signals related to the operations of the plurality of planes 200.

Figure 19:
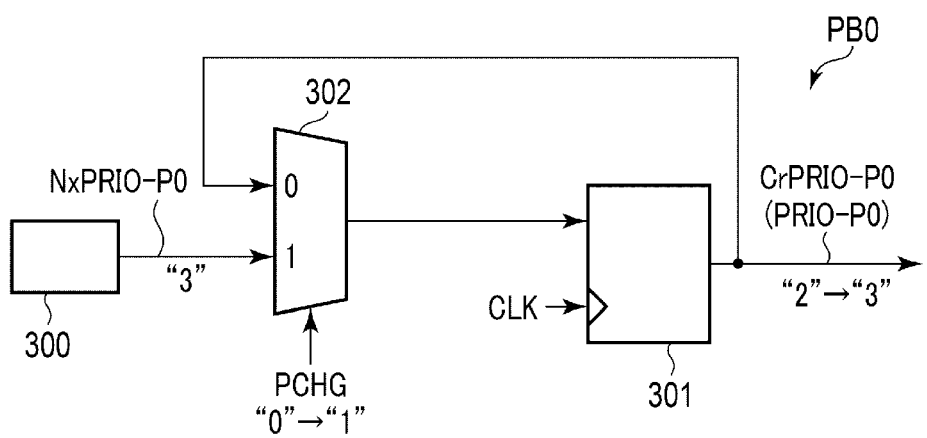

FIG. 19 is a diagram for describing a change in the priority of the operation of a plane when the semiconductor memory of the present embodiment operates. In FIG. 19, a change in the operation and the state of the priority storing circuit when the state STA23 in FIG. 15 transitions to the state STA24 is illustrated.

As illustrated in FIG. 19, in the priority storing circuit PB0 of the first plane 200-0, the calculation circuit 300 outputs the update signal NxPRIO-P0 of "3" in response to a change in the internal busy signal BS-P1 to the level "L" from the level "H" caused by the completion of the operation of the plane 200-1.

The update signal NxPRIO-P0 of "3" is stored in the register 301 via the selector 302. In such a manner, in the priority storing circuit PB0, the priority stored by the register 301 is increased. The register 301 outputs the priority signal PRIG-P0 of "3".

The value of the priority storing circuit PB2 of the third plane 200-2 is also changed to "3" from "2" by the same operation as the operation in FIG. 19.

In such a manner, after the operation of the plane 200-1 that is most preferentially executed up to the present is finished, the read operations of the first and third planes 200-0 and 200-2 are changed to the most preferential operations from the operations having the second priority.

Time t25

When the read operations of the first plane 200-0 and the third plane 200-2 are finished, the internal state signals of each plane are changed.

Accordingly, at time t25, the states of the plurality of planes are changed to a state STA25 from the state STA24 as will be described below.

Figure 20:
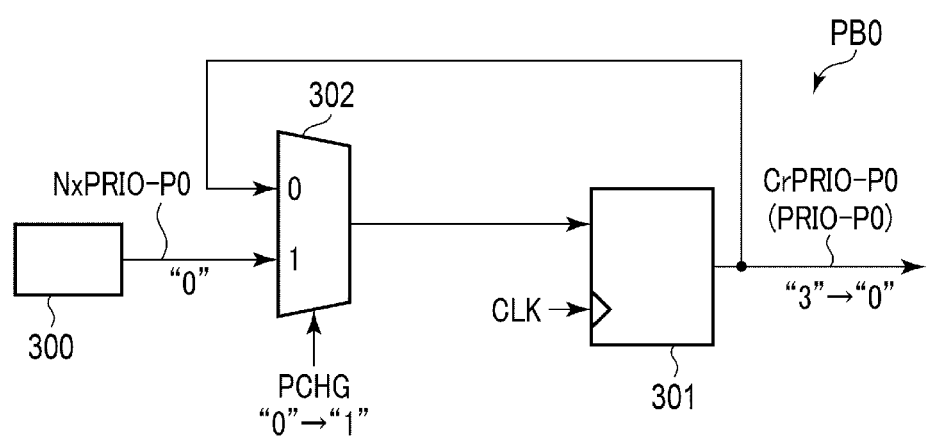

FIG. 20 is a diagram for describing a change in the priority of the operation of a plane when the semiconductor memory of the present embodiment operates. In FIG. 20, a change in the operation and the state of the priority storing circuit when the state STA24 in FIG. 15 transitions to the state STA25 is illustrated.

As illustrated in FIG. 20, in the priority storing circuit PB0 of the first plane 200-0, the calculation circuit 300 outputs the update signal NxPRIO-P0 of "0" in response to a change in the internal busy signal BS-P0 to the level "L" from the level "H".

The signal PCHG of "1" causes the selector 302 to output the update signal NxPRIO-P0 to the register 301.

The register 301 stores the priority CrPRIO-P0 of "0". The register 301 outputs the priority signal CrPRIO-P0 of "0".

Accordingly, the completion of the operation of the first plane 200-0 is indicated.

The value of the priority storing circuit PB2 of the third plane 200-2 is also changed to "0" from "3" by the same operation as the operation in FIG. 20.

Data that is read from each of the planes 200-0, 200-1, and 200-2 is transmitted to the memory controller 5 from the semiconductor memory 1 at a predetermined timing. As described above, when the data is transmitted, the semiconductor memory 1 can notify the controller 5 of the plane 200 from which data can be read (the plane for which the command can be issued), via the terminal RBnx using the internal busy signal BS (or a signal generated from the internal busy signal BS). Accordingly, even when the read operations of the plurality of planes are executed in parallel, the controller 5 can identify the plane from which data is read.

Then, the signal level of the ready/busy signal RBnx is changed to the level "H" from the level "L".

As described thus far, the operations of the plurality of planes are complete in the operation of the semiconductor memory of the present embodiment.

In the present embodiment, the content of each plane in the states STA21 to STA25 during the operation of the semiconductor memory can be output at any time using at least one of the plurality of methods in FIG. 10A to FIG. 10C.

As described above, in the semiconductor memory of the present embodiment, the operations of the plurality of planes are executed in parallel based on the priority (priority order) that is set for each plane depending on the supplied command CMDx and the operating status of the semiconductor memory.

In the present embodiment, in the operations of the plurality of planes, the execution timings of the internal processes in the planes during the operations in execution are controlled based on the priority and the arbitration signal.

Conclusion

In the semiconductor memory and the memory system of the present embodiment, the semiconductor memory executes the operations of the plurality of planes in parallel.

In the present embodiment, the priority (priority order) of operation is set for the operations of the plurality of planes. The semiconductor memory of the present embodiment preferentially executes an operation for which a high priority is set.

In the semiconductor memory of the present embodiment, when an operation for which arbitration of operation among the planes is desired is executed, the arbitration signal that indicates execution of arbitration is activated for the corresponding plane.

In the present embodiment, the operating order (timing) of the plurality of planes is controlled based on the priority and the arbitration signal.

For example, when the operations of the plurality of planes are executed in parallel, and each plane independently executes the operation, executing the operations in the plurality of planes at the same may not be preferable from the viewpoint of loads caused by the operations.

For example, when the read operations are executed in the plurality of planes at the same time, there is a possibility of drop in the internal electric potential of the semiconductor memory along with high current consumption. In this case, the operation of the semiconductor memory becomes unstable.

In order to avoid a situation such as a drop in internal electric potential that is not preferable, the semiconductor memory of the present embodiment can perform arbitration of the operations of the plurality of planes 200 using the priority control circuit 52 that includes the priority storing circuits PB.

When the possibility of overlap between the timing of charging the interconnections in the plane executing an operation having a high priority and the timing of charging in the plane executing an operation having a low priority is detected based on the arbitration signal, the semiconductor memory sets the charging of the interconnections in the plane executing the operation having a low priority to the wait state (or the slow state). Accordingly, in the present embodiment, the control circuit in the semiconductor memory preferentially executes charging of the interconnections in the plane executing the operation having a high priority.

Therefore, the semiconductor memory of the present embodiment can avoid an overlap between the timings of currents flowing in the plurality of planes. Accordingly, the semiconductor memory of the present embodiment can reduce the peak value of the current consumption that occurs during the operations of the plurality of planes.

Consequently, the semiconductor memory of the present embodiment can reduce a decrease in internal electric potential caused by high current consumption.

Therefore, the operation of the semiconductor memory of the present embodiment can be stabilized.

In the semiconductor memory of the present embodiment, the timings of the operations of the plurality of planes executed in parallel are controlled based on the priority. In addition, in the semiconductor memory of the present embodiment, when a determination is made that the timing of charging (or current flow) the interconnections in the plane executing the operation having a high priority does not overlap with the timing of charging in the plane executing the operation having a low priority, the operation having a low priority can be executed earlier than the operation having a high priority.

Accordingly, the semiconductor memory and the memory system of the present embodiment can avoid congestion of operations of the memory system, and the efficiency of operation can be increased.

As described thus far, the semiconductor memory and the memory system of the present embodiment can improve operating characteristics.

[2] Second Embodiment

A semiconductor memory and a memory system of a second embodiment will be described with reference to FIG. 21 to FIG. 25.

In the semiconductor memory and the memory system of the present embodiment, a memory controller can set any priority (priority order) for the operation to be executed by each plane. Accordingly, the semiconductor memory and the memory system of the present embodiment provides a flexibility in controlling the operation of the semiconductor memory.

Consequently, the semiconductor memory and the memory system of the present embodiment can improve the convenience of a memory and a system.

As will be described below, the semiconductor memory and the memory system of the present embodiment set the priority order of operations and control the parallel operations of the plurality of planes.

(a) Configuration Example A configuration example of the semiconductor memory (for example, a semiconductor memory) of the present embodiment will be described with reference to FIG. 21 to FIG. 23.

Sequence Control Circuit

Figure 21:
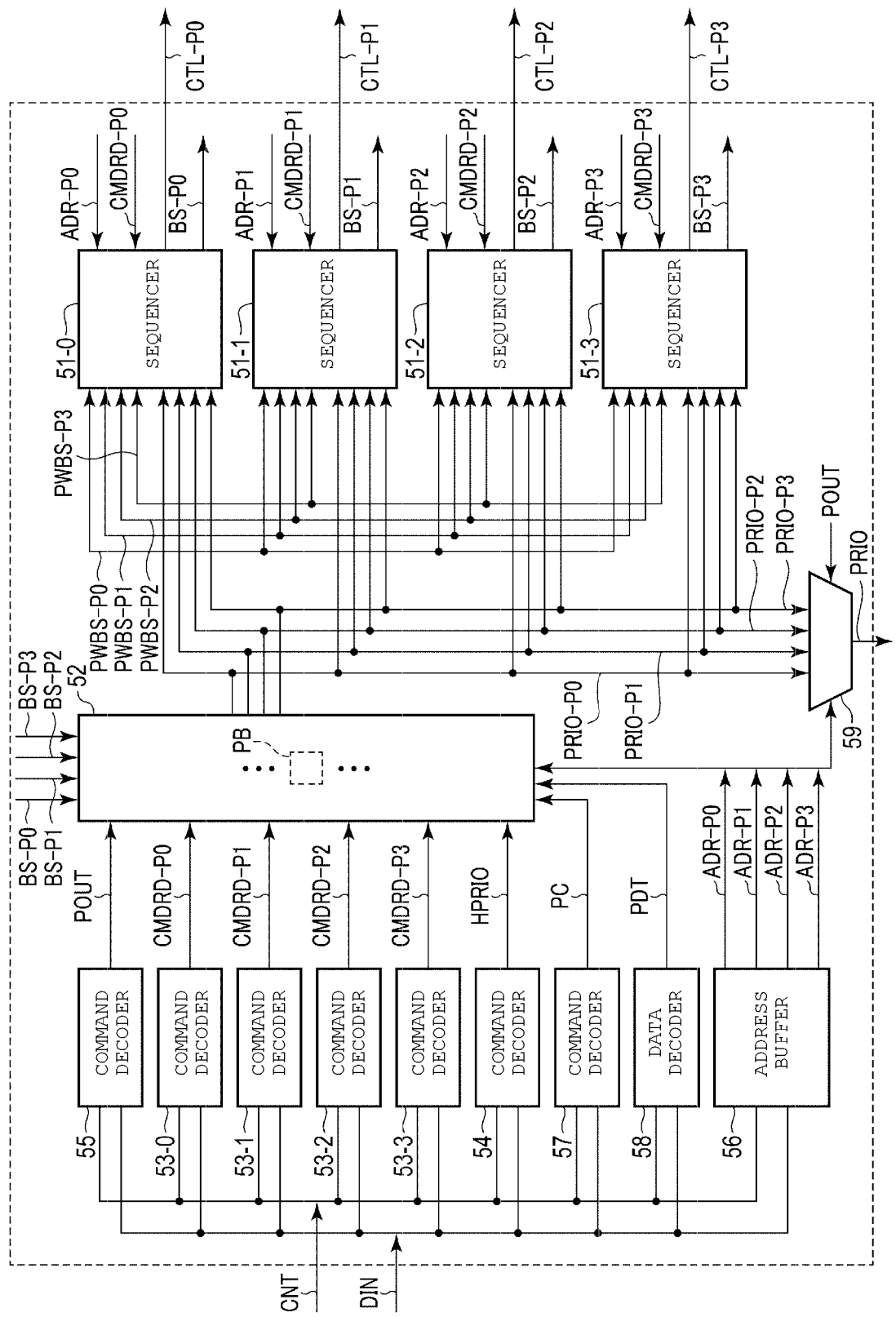
FIG. 21 is a block diagram of a sequence control circuit in a semiconductor memory of a second embodiment.

FIG. 21 is a block diagram for describing a configuration example of the semiconductor memory of the second embodiment. In FIG. 21, a main part of a sequence control circuit related to the semiconductor memory of the present embodiment is extracted and illustrated.

As illustrated in FIG. 21, in the semiconductor memory of the present embodiment, the sequence control circuit 15 further includes a command decoder 57 and a data decoder 58.

The signal CNT from the input buffer circuit 101 and the signal DIN from the input buffer circuit 102 are supplied to the command decoder 57 and the data decoder 58.

The command decoder 57 outputs a signal PC. The signal PC is supplied to the priority control circuit 52.

The signal PC is a control signal that enables the value of the priority of the operation of a predetermined plane to be set to a value for which an instruction is provided from the outside. The signal PC is generated from the command from the memory controller 5 (or the host device 600).

The data decoder 58 outputs a signal PDT. The signal PDT is supplied to the plurality of priority storing circuits PB in the priority control circuit 52.

The signal PDT is data that is transmitted as the I/O signal DIN to the semiconductor memory 1 from the memory controller 5. The signal PDT is a signal (data or information) that indicates the priority of the operation commanded by the memory controller 5 (or the host device 600).

Hereinafter, the signal PDT will be referred to as priority setting data.

Priority Storing Circuit

Figure 22:
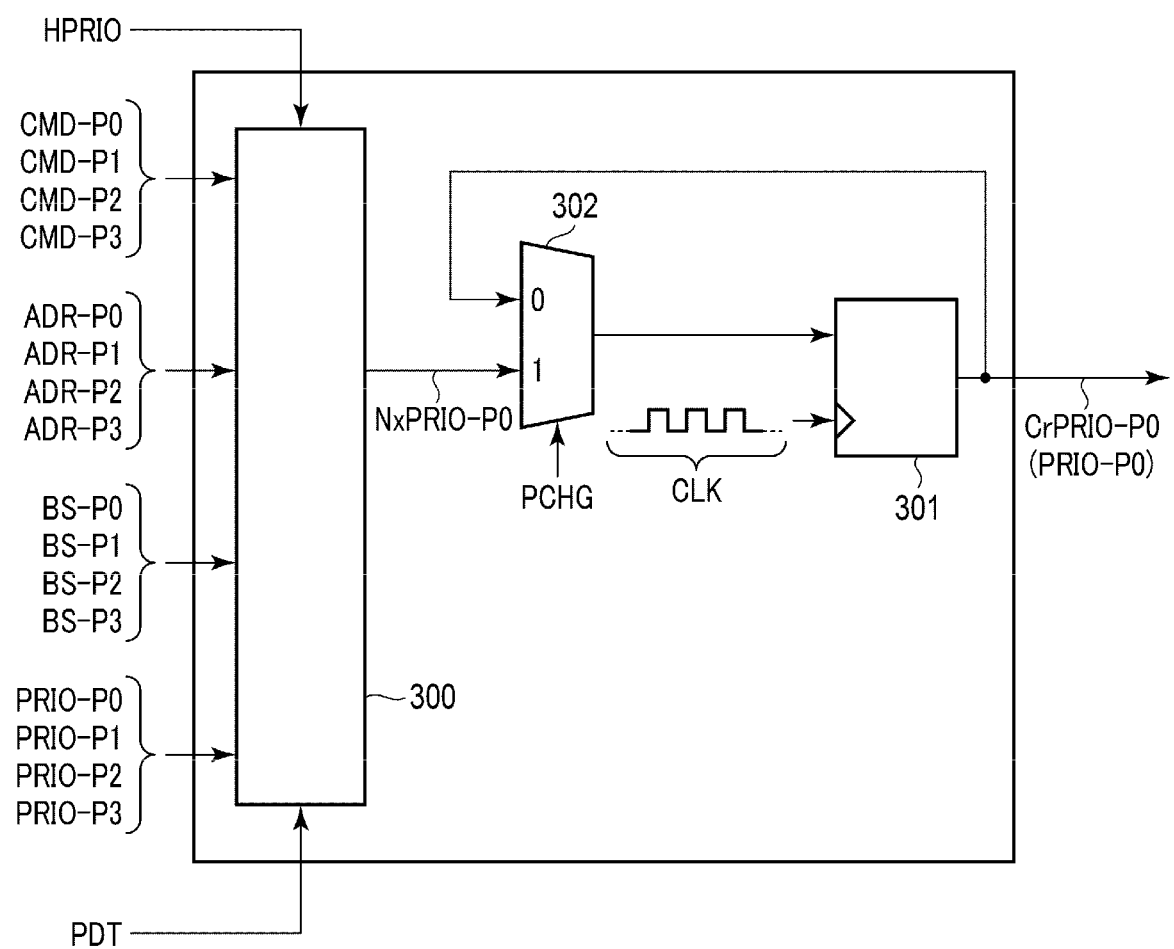
FIG. 22 is a block diagram illustrating a configuration example of a priority storing circuit in the semiconductor memory of the second embodiment.
Figure 23:
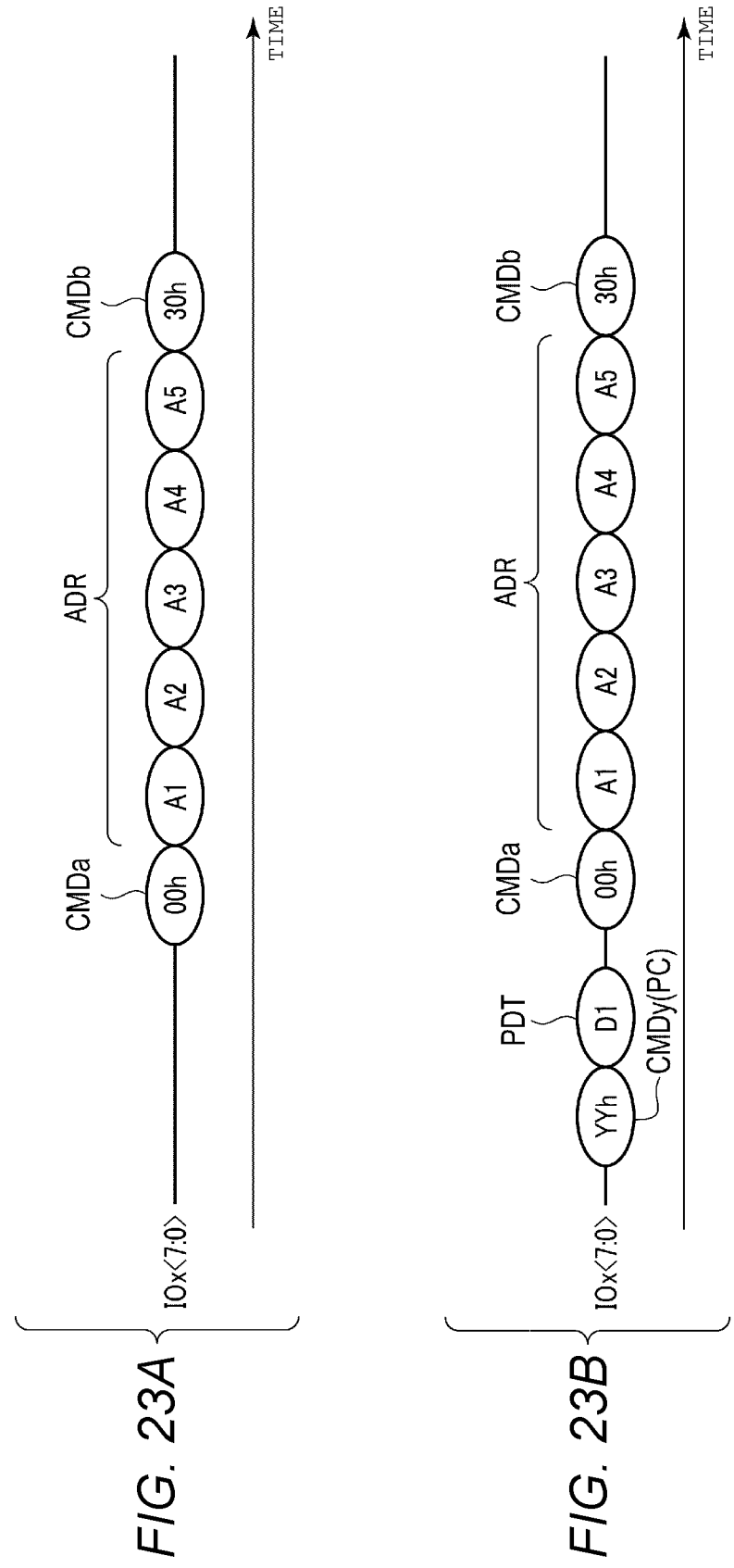
FIGS. 23A and 23B are diagrams illustrating a command sequence of the semiconductor memory of the second embodiment.

FIG. 22 is a block diagram illustrating one example of a configuration of each priority storing circuit in the priority control circuit 52 in the semiconductor memory of the present embodiment. In FIG. 22, the priority storing circuit PB0 corresponding to the first plane is illustrated. Internal configurations of the priority storing circuits corresponding to the other planes are substantially the same as the configuration illustrated in FIG. 22.

As illustrated in FIG. 22, the priority setting data PDT is supplied to the calculation circuit 300 of each priority storing circuit PB.

The signal PCHG is caused to transition to the level "1 (H)" from the level "0 (L)" by the priority control circuit 52 in response to the activation of the control signal PC.

In each priority storing circuit PB, the calculation circuit 300 performs a calculation process using the input priority setting data PDT in the priority control circuit 52. Accordingly, the calculation circuit 300 determines the update signal NxPRIO.

In such a manner, in the semiconductor memory of the present embodiment, a value indicated by the priority setting data PDT is reflected on the update signal NxPRIO (NxPRIO-P0 to NxPRIO-P3).

When the signal PCHG at the level "1" is supplied to the selector 302, the output signal of the calculation circuit 300 is acquired by the register 301 through the selector 302.

Command Protocol

FIGS. 23A and 23B are diagrams illustrating a command sequence in the semiconductor memory and the memory system of the present embodiment.

FIG. 23A illustrates a command sequence of a read command. FIG. 23A is the same command sequence as FIG. 9A.

FIG. 23B illustrates a command sequence that is used in the semiconductor memory and the memory system of the present embodiment.

As illustrated in FIG. 23B, the priority setting data PDT is supplied to the semiconductor memory 1 from the memory controller along with a command ("YYh" in FIG. 23B) CMDy.

The command CMDy is added to the priority setting data PDT in order to transmit and receive the priority setting data PDT.

The command CMDy is a command for setting the priority of the operation to be started and/or changing the priority (priority order) of the operation in execution. Hereinafter, the command CMDy will be referred to as a priority setting command.

The priority change command CMDy is input into the command decoder 57 in the priority control circuit 52. The command decoder 57 interprets the priority change command CMDy. Accordingly, the command decoder signal PC is generated. Consequently, each priority storing circuit PB is set to a state where the priority can be set/changed.

The command CMD and the address ADR follow the priority setting command CMDy and the priority setting data PDT. In the command sequence in FIG. 23B, the command CMD and the address ADR after the priority setting data PDT include the command of the operation of the plane for which the priority is set or changed, and the address of the operation target.

For example, when the priority of the operation in execution is changed by the priority setting command CMDy and the priority setting data PDT, the command CMD and the address ADR may be transmitted again.

The priority setting command CMDy and the priority setting data PDT may be included in information related to the plane (and the operation thereof) of a target for setting/changing the priority. In this case, when the priority of the operation corresponding to the command that is already transmitted is changed, only the priority setting command CMDy and the priority setting data PDT are transmitted to the semiconductor memory 1 from the memory controller 5 without transmitting the operation command and the address again.

In the same manner as the first embodiment, the semiconductor memory of the present embodiment can output the priority. The memory controller 5 can determine the value of the priority to be set/changed based on the priority output from the semiconductor memory 1.

(b) Operating Example

An operating example of the semiconductor memory and the memory system of the present embodiment will be described with reference to FIG. 24 and FIG. 25. FIG. 1 to FIG. 22 will be appropriately referred to for description of the semiconductor memory and the memory system of the present embodiment.

Figure 24:
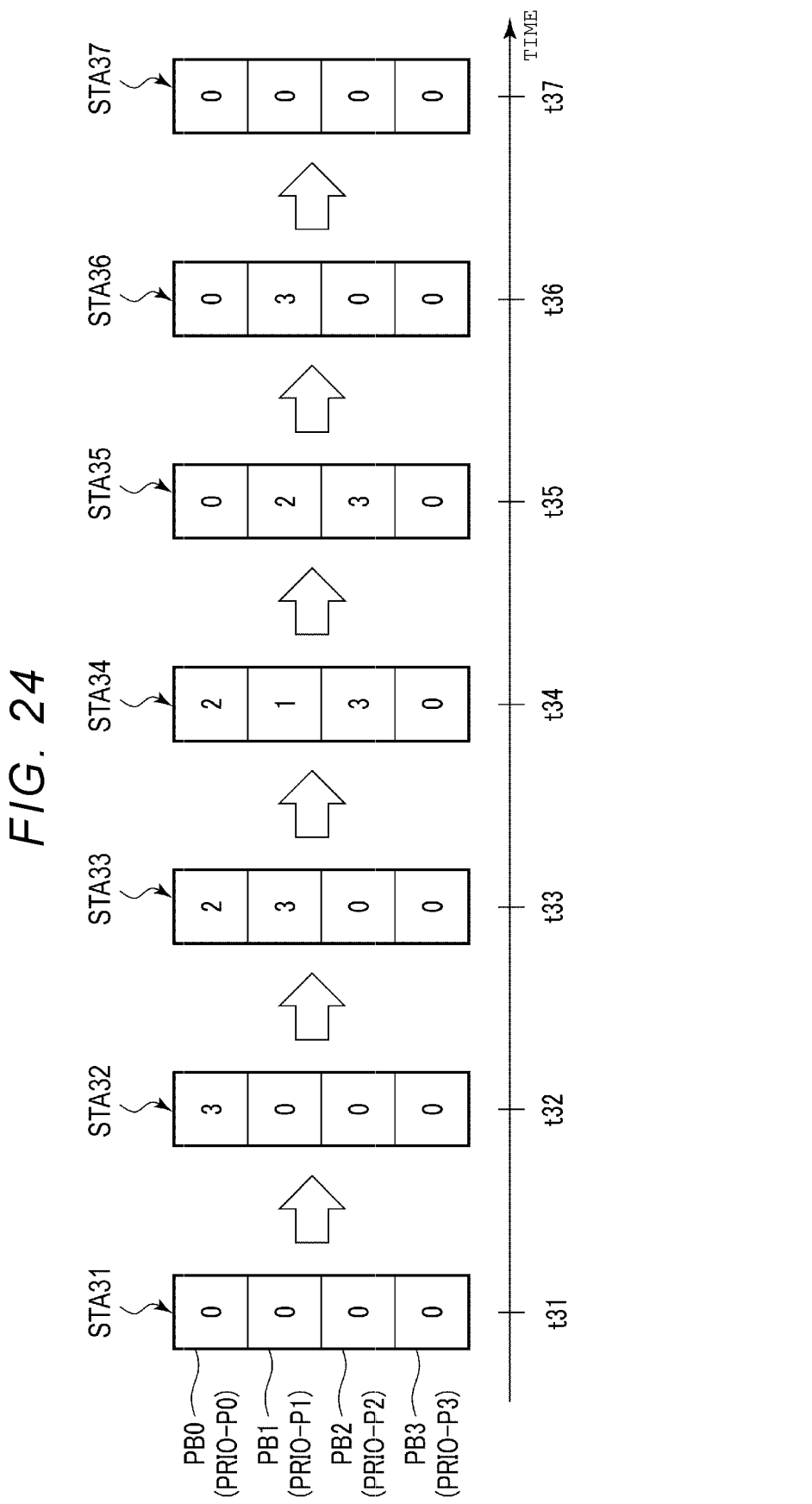
FIG. 24 is a diagram for describing an operation example of the semiconductor memory of the second embodiment.

FIG. 24 is a diagram for describing a change in the priority of each of the plurality of planes in the operating example of the semiconductor memory of the present embodiment. In the example illustrated in FIG. 24, a case where arbitration of operation among the planes occurs due to the operations of the plurality of planes performed at the same time will be described.

Figure 25:
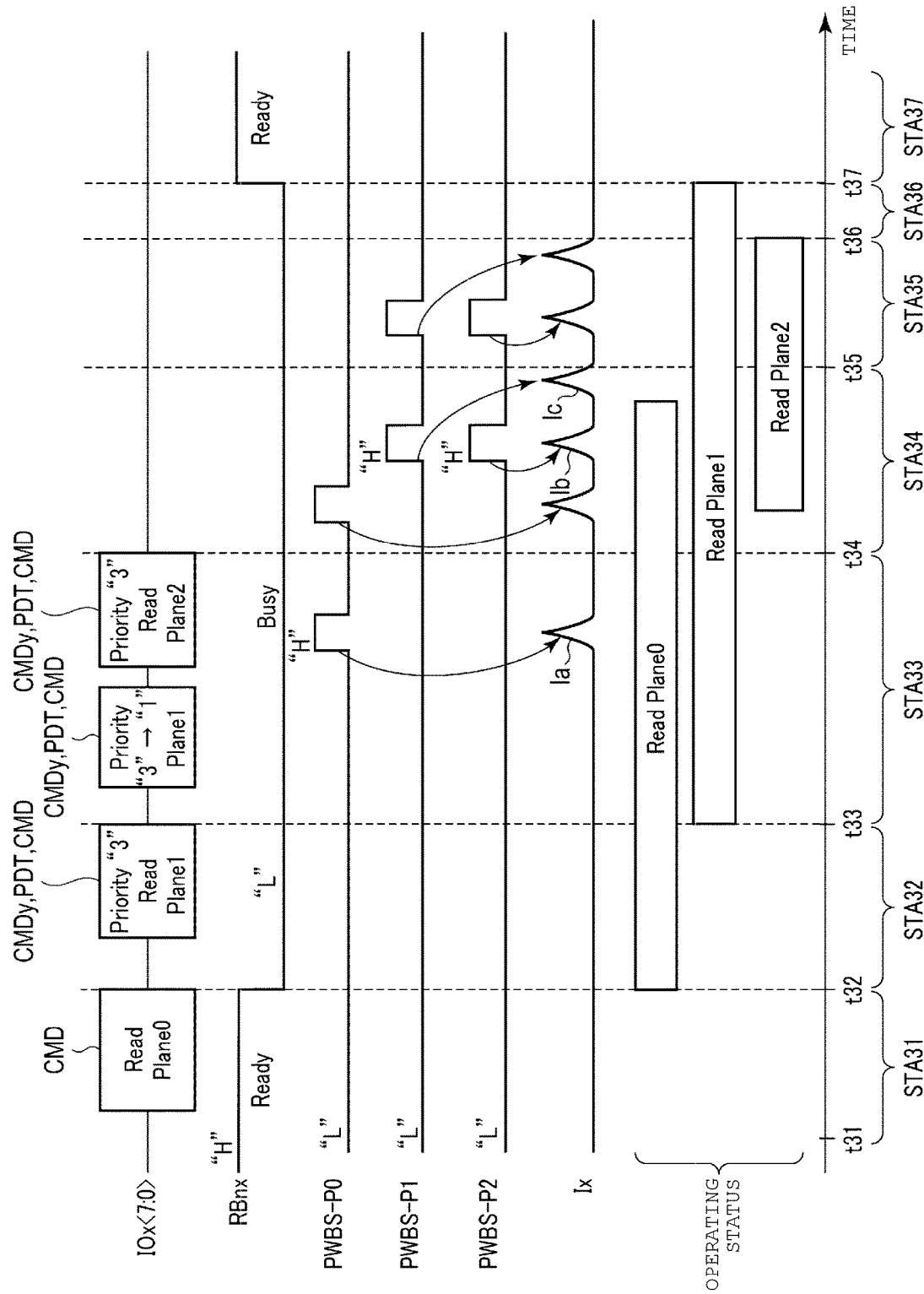
FIG. 25 is a timing chart for describing changes in various signals during operation of the semiconductor memory of the second embodiment.

FIG. 25 is a timing chart for describing a change in various signals with respect to the operating status of the semiconductor memory of the present embodiment. A horizontal axis in FIG. 25 corresponds to time. In FIG. 25, the I/O signals IOx, the ready/busy signal RBnx, the arbitration signal PWBS, and the current Ix are illustrated.

In the example illustrated in FIG. 24 and FIG. 25, the read operations of the plurality of planes are executed in parallel while the priority order of the operations is changed by the internal process and an instruction from the outside (for example, the memory controller).

In the present embodiment, the operations of the plurality of planes are executed in the following flow.

After the read operation of the first plane 200-0 is started, the read operation of the second plane 200-1 is executed with the highest priority order by an instruction from the memory controller 5. At this point, the priority order of the read operation of the first plane 200-0 in execution is decreased.

The priority order of the read operation of the second plane 200-1 is changed to the lowest priority order by an instruction from the memory controller 5.

The read operation of the third plane 200-2 is executed with the highest priority order by an instruction from the memory controller 5.

The read operation of the first plane 200-0 is complete first. Next, the read operation of the third plane 200-2 is complete. Lastly, the read operation of the second plane 200-1 is complete.

Hereinafter, an operating example of the memory system and the semiconductor memory of the present embodiment will be more specifically described.

Time t31

As illustrated in FIG. 24 and FIG. 25, at time t31, in each plane 200 of the semiconductor memory 1, each priority storing circuit PB has a state STA31. The state STA31 is a state before the operation (for example, the read operation) of each plane is started in the semiconductor memory 1.

The state of the priority storing circuit PB of each plane 200 is set to the initial state (a state where the read operation is not started).

In each priority storing circuit PB, the value of the priority signal PRIG is set to "0".

Time t32

At time t32, when the command (for example, the read command) CMD is received, the state of each priority storing circuit is changed to a state STA32 from the state STA31.

The commands CMDa and CMDb and the address ADR illustrated in FIG. 23A are transmitted to the semiconductor memory 1 from the memory controller 5.

Accordingly, at time t32, the read operation of the first plane 200-0 is started.

In substantially the same manner as the operation in FIG. 17, the value of the priority signal PRIG-P0 stored by the register 301 in the priority storing circuit PB0 corresponding to the first plane 200-0 is changed to "3" from "0".

The sequence control circuit 15 changes the signal level of the ready/busy signal RBnx to the level "L" from the level "H".

Time t33

After the command for the first plane 200-0 is received in the semiconductor memory 1, the memory controller 5 transmits the priority setting command CMDy, the priority setting data PDT, the commands CMDa and CMDb, and the address ADR to the semiconductor memory 1. The command CMDy and the priority setting data PDT are transmitted before the command CMD and the address ADR.

The semiconductor memory 1 receives the priority setting command CMDy, the priority setting data PDT, the command CMD, and the address ADR.

Based on the priority setting command CMDy and the priority setting data PDT, the state of each priority storing circuit PB is changed such that the priority of the operation of the second plane 200-1 is set.

In the present example, the command sequence including the priority setting command CMDy and the priority setting data PDT causes the priority of the operation of the second plane 200-1 to be set to a value corresponding to the priority setting data PDT.

The priority setting command CMDy is supplied to the command decoder 57 in the semiconductor memory 1. The command decoder 57 interprets the priority setting command CMDy. Accordingly, the signal PC is activated.

The priority setting data PDT is supplied to the data decoder 58. The data decoder 58 interprets the supplied priority setting data PDT. The interpretation result of the priority setting data PDT is supplied to the plurality of priority storing circuits PB as one of signals for calculating the update signal NxPRIO.

The activated signal PC causes the priority control circuit 52 and each priority storing circuit PB to recognize that the priority of the operation corresponding to the command that is received along with the supplied command CMDy is set (changed) to a value based on the priority setting data PDT.

The value of the update signal NxPRIO is determined by the calculation process using the priority setting data PDT.

For example, in the example in FIG. 24 and FIG. 25, the priority setting data PDT is set to data (value) corresponding to the priority "3".

At time t33, the signal PC and the priority setting data PDT are supplied to each priority storing circuit PB in addition to the various signals CMDRD, BS, and PRIG.

Each priority storing circuit PB recognizes that the plurality of signals CMDRD, BS, PRIG, and PC and the priority setting data PDT are signals for the priority storing circuit PB1 of the second plane 200-1.

Accordingly, in the priority storing circuit PB1, the priority PRIG-P1 in the register 301 is changed to "3" from "0" based on the signals.

Meanwhile, in the priority storing circuit PB0 of the first plane 200-0, the priority signal PRIG-P0 (CrPRIO-P0) in the register 301 is decreased to "2" from "3" based on the signals CMDRD, BS, PRIG, and PC and the priority setting data PDT by an operation similar to the operation in FIG. 18.

Time t34

In the example in FIG. 24 and FIG. 25, after the command for the second plane 200-1 is received in the semiconductor memory 1, the memory controller 5 transmits the commands for the other planes to the semiconductor memory 1.

When the priority of the operation in execution in the second plane 200-1 is changed, the memory controller 5 transmits the priority setting command CMDy and the priority setting data PDT for the second plane 200-1 executing the operation to the semiconductor memory 1 before transmitting the commands (and the addresses) for the other planes.

At time t34, when the command sequence including the priority setting command CMDy is received, the state of the priority of the operation of each plane 200 in the semiconductor memory 1 is changed to a state STA34 from the state STA33.

In the present example, the priority of the operation of the second plane 200-1 is changed based on the command sequence including the priority setting command CMDy and the priority setting data PDT.

As described above, the interpretation result (signal PC) of the priority setting command CMDy and the interpretation result of the priority setting data PDT are supplied to the plurality of priority storing circuits PB as signals for calculating the update signal NxPRIO. The value of the update signal NxPRIO is determined by the calculation process using the priority setting data PDT.

The value of the priority storing circuit PB2 is changed to a value corresponding to the priority setting data PDT based on the result of the calculation process.

For example, the priority setting data PDT is set to data (value) corresponding to the priority "1".

Accordingly, the value of the priority signal PRIO-P1 of the second plane 200-1 is decreased to "1" from "3".

After the command for changing the priority for the second plane 200-1 is transmitted, the memory controller 5 transmits the command CMD and the address ADR for the third plane 200-2 to the semiconductor memory 1. The priority setting command CMDy and the priority setting data PDT are transmitted in order to set the priority of the operation of the third plane 200-2. The priority setting command CMDy and the priority setting data PDT cause the priority of the operation of each plane 200 to be set such that the read operation of the third plane 200-2 is set with the highest priority order.

Accordingly, the value of the priority signal PRIO-P2 of the third plane 200-2 is set to "3".

The value of the priority signal PRIG-P0 of the first plane 200-0 is maintained at "2". The value of the priority signal PRIO-P1 of the second plane 200-1 is maintained at "1".

In such a manner, at time t34, the priority setting command CMDy and the priority setting data PDT cause the read operation of the second plane 200-1 to be changed to have a priority lower than the priority of the read operation of each of the first and third planes 200-0 and 200-2.

Consequently, the read operation of the third plane 200-2 is started in a state where the priority of the read operation of the third plane 200-2 is set to the highest value such that the read operation of the third plane 200-2 is preferentially executed.

As described in the first embodiment, based on the priority signal PRIG and the arbitration signal PWBS, the read operation of the third plane 200-2 is preferentially executed over the read operations of the other planes 200 such that the timings of a load (a current and/or noise) in each plane 200 do not overlap with each other. For example, the read operation of the third plane 200-2 is executed in a state where the operation of the plane that is set to have a priority lower than the priority of the operation of the third plane is set to the slow state or the wait state.

Accordingly, the timing of a load in the plane executing the operation having a low priority is shifted to be later than the timing of a load in the plane executing the operation having a high priority such that the timings of loads in the plurality of planes 200 do not overlap with each other.

When the memory controller 5 transmits the priority setting command CMDy, for example, the priority of each plane in the semiconductor memory 1 may be output to the memory controller 5 by the priority output command in FIGS. 10A to 10C before the priority setting command CMDy and the priority setting data PDT are transmitted. Accordingly, the memory controller 5 can appropriately control the value of the priority setting data PDT based on the output priority.

Time t35

At time t35, the state of the operation of each plane 200 is changed to a state STA35 from the state STA34.

When the internal process is not shifted by arbitration, there is a possibility that the operation having a low priority is finished earlier than the operation having a high priority.

For example, during the period from time t34 to time t35, the read operation of the first plane 200-0 having the second priority is finished.

Accordingly, the internal busy signal BS-P0 of the first plane 200-0 is deactivated. The internal busy signal BS-P0 at the level "L" is supplied to each priority storing circuit PB. The priority signal PRIG-P0 stored in the priority storing circuit PB0 of the first plane 200-0 is changed to "0" from "2".

Along with the completion of the operation of the first plane 200-0, the priority of the operation of the second plane 200-1 is increased to "2" from "1" based on the internal busy signal BS-P0 at the level "L". In the present example, the priority of the operation of the second plane 200-1 may be maintained at the value "1".

The operation of the third plane 200-2 is executed in parallel with the operation of the second plane 200-1.

For example, by detecting the arbitration signal PWBS-P2 at the level "H" for the third plane 200-2, the sequencers 51-1 and 51-2 control the operating timings of the corresponding planes 200-1 and 200-2 based on the priority signal PRIG such that the timing of a current flow in the second plane 200-1 is shifted to be later than the timing of a current flow in the third plane 200-2.

In such a manner, the operations of the plurality of planes 200 are arbitrated such that the operation of the plane 200-2 having a high priority is preferentially executed.

Accordingly, in the semiconductor memory 1, the timings of currents flowing in the planes 200 are distributed.

As described thus far, the read operation of the third plane 200-2 is complete.

Time t36

At time t36, the state of the operation of each plane is changed to a state STA36 from the state STA35 as will be described below.

When the read operation of the third plane 200-2 is complete, the state of each priority storing circuit is changed to the state STA36 from the state STA35.

The internal busy signal BS-P2 is deactivated. The internal busy signal BS-P2 at the level "L" is supplied to each priority storing circuit PB.

When the read operation is finished, the value stored in the priority storing circuit PB2 of the third plane 200-2 is changed to "0" from "3".

Consequently, the semiconductor memory 1 is in a state where the read operation of the second plane 200-1 that is not complete is in execution alone.

Thus, the priority stored in the priority storing circuit PB of the second plane 200-1 is changed to "3" from "2". In the present example, when a transition is made to a single operation of one plane from parallel operations of the plurality of planes, the value of the priority stored in the priority storing circuit PB1 of the second plane 200-1 may not be changed.

Time t37

At time t37, the read operation of the second plane 200-1 is complete. When the read operation is finished, the value PRIO-P1 stored in the priority storing circuit PB of the second plane P1 is changed to "0" from "3".

Accordingly, the state of the operation of each plane is changed to a state STA37 from the state STA36.

Consequently, all planes 200 in the semiconductor memory 1 are in a state where operations (for example, the read operations) are not executed.

As described above, data read from each plane 200 is transmitted to the memory controller 5 from the semiconductor memory 1 at an appropriate timing. In the same manner as the above embodiment, the internal busy signal (or a signal generated from the internal busy signal) may be transmitted to the memory controller 5 from the semiconductor memory 1 via the terminal RBnx in order to notify the memory controller 5 of whether data can be read from each plane 200 (whether a new command can be issued).

As described thus far, the parallel operations of the plurality of planes in the semiconductor memory of the present embodiment are finished.

In the present embodiment, the content of each plane in the states STA31 to STA37 during the operation of the semiconductor memory can be output at any time using at least one of the plurality of methods in FIG. 10A to FIG. 10C.

In the semiconductor memory and the memory system of the present embodiment, the command sequence including the high priority command CMDx and the command sequence including the priority setting command CMDy may be used together.

CONCLUSION

As in the present embodiment, the priority of the operation of each plane can be changed from the outside of the semiconductor memory 1 using the command from the memory controller.

Accordingly, the semiconductor memory and the memory system of the present embodiment can improve the flexibility in operations.

In addition, the semiconductor memory and the memory system of the present embodiment can have flexibility with respect to the operating status and requests of a device connected to the semiconductor memory.

Therefore, the semiconductor memory and the memory system of the present embodiment can improve the flexibility in management/operation of a system.

As described thus far, the semiconductor memory and the memory system of the present embodiment can improve operating characteristics.

[3] Third Embodiment

A semiconductor memory and a memory system of a third embodiment will be described.

Execution of the read operation of the semiconductor memory is illustrated as an operating example of the semiconductor memory and the memory system of the above embodiments.

The operation executed by the semiconductor memory may be a status read.

The status read is an operation of transmitting status information to the memory controller from the semiconductor memory. The status information indicates success or failure of the operation (a read, a write, and an erase) executed in the semiconductor memory. Accordingly, the memory controller can confirm success or failure in the operation in the semiconductor memory.

The operation of each plane executed in the above embodiments is not limited to the read operation and may be the write operation or the erase operation.

In the present embodiment, the operation that is executed in parallel in each plane is not limited to the same operation. The read operation, the write operation, and the erase operation may coexist.

[4] Others

The flash memory is illustrated as the semiconductor memory of the present embodiment.

The memory of the present embodiment may be a memory device that includes a plurality of planes (control units that can operate in parallel).

For example, the memory device (semiconductor memory) of the present embodiment may be a ReRAM, an MRAM, a DRAM, or an SRAM.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory comprising:
   a first plane that includes a first memory cell array including a first memory cell;
   a first word line connected to a gate of the first memory cell;
   a first bit line connected to one end of the first memory cell;
   a second plane that includes a second memory cell array including a second memory cell;
   a second word line connected to a gate of the second memory cell;
   a second bit line connected to one end of the second memory cell;
   an input output circuit configured to receive: a) a first command for the first plane to execute a first operation, the first operation including a first process, and b) a second command for the second plane to execute a second operation, the second operation including a second process;
   a driver circuit configured to apply voltages to the first word line, the second word line, the first bit line and the second bit line; and
   a control circuit that includes:
      a first circuit configured to store a first priority for the first operation performed on the first plane, and
      a second circuit configured to store a second priority for the second operation performed on the second plane,
      wherein the control circuit is configured to control the first operation and the second operation such that such that a timing of the first process in the first operation and a timing of the second process in the second operation are not overlapped, by delaying the first process or the second process based on the first priority and the second priority.

2. The semiconductor memory according to claim 1, wherein the first process involves at least one of charging of the first word line or charging of the first bit line by the driver circuit, and
   wherein the second process involves at least one of charging of the second word line or charging of the second bit line by the driver circuit.

3. The semiconductor memory according to claim 1, wherein
   when a value of the second priority is higher than a value of the first priority, the control circuit delays the first process until the second process ends, and
   when the value of the first priority is higher than the value of the first second priority, the control circuit delays the second process until the first process ends.

4. The semiconductor memory according to claim 3, wherein
   the control circuit further includes:
      a first sequencer circuit for the first plane, and
      a second sequencer circuit for the second plane,
   when the value of the second priority is higher than the value of the first priority, the second sequencer circuit outputs a first signal that indicates a start of the second process in the second operation, and the first sequencer circuit delays a start timing of the first process in the first operation based on the first signal.

5. The semiconductor memory according to claim 4, wherein a peak of current consumption in the second process is larger than an average current consumption of the second operation.

6. The semiconductor memory according to claim 5, wherein
   when the value of the first priority is higher than the value of the second priority, the first sequencer circuit outputs a second signal that indicates the start of the first process in the first operation, and the second sequencer circuit delays the start timing of the second process in the second operation based on the second signal, and
   a peak of current consumption in the first process is larger than an average current consumption of the first operation.

7. The semiconductor memory according to claim 4, wherein the first and second circuits set the values of the first and second priorities based on an input order of the first and second commands, and a priority setting data contained in at least one of the first and second commands.

8. The semiconductor memory according to claim 1, wherein
   when the first command includes an instruction to change a priority of the first operation, the control circuit causes the first circuit to store the first priority based on the instructed priority of the first operation.

9. The semiconductor memory according to claim 8, wherein
   the second command is received after the first command, and
   when the second command includes an instruction to change a priority of the second operation, the control circuit causes the second circuit to store the second priority based on the instructed priority of the second operation and the instructed priority of the first operation.

10. The semiconductor memory according to claim 9, wherein
    the first circuit increases the value of the first priority upon completion of the second operation.

11. The semiconductor memory according to claim 1, wherein
    when the control circuit receives from a controller, a command that includes an instruction to transmit a value of the first priority of the first operation, the control circuit transmits the value of the first priority to the controller in response to the command via the input output circuit.

12. The semiconductor memory according to claim 1, wherein
    the first memory cell is capable of storing a plurality of bits of data by being set to have one of a plurality of threshold voltage levels,
    each of the first operation and the second operation is a read operation,
    in the first operation, a plurality of levels of read voltages are applied to the first word line, apply of a first one of the read voltages corresponding to the first process, apply of a second one of the read voltages corresponding to a third process after the first process,
    in the second operation, the plurality of levels of read voltages are applied to the second word line, apply of the first one of the read voltages corresponding to the second process, apply of the second one of the read voltages corresponding to a fourth process after the second process, and
    the control circuit controls when the value of the second priority is higher than the value of the first priority, the controller circuit delays at least one of the first and third processes until at least one of the second and fourth processes ends such that timings of the first and third processes in the first operation and timings of the second and fourth processes in the second operation are not overlapped.

13. A method of performing parallel operations in a semiconductor memory including a first memory cell array in a first plane that includes a first memory cell, a first word line connected to a gate of the first memory cell, and a first bit line connected to one end of the first memory cell, and a second memory cell array in a second plane that includes a second memory cell, a second word line connected to a gate of the second memory cell, and a second bit line connected to one end of the second memory cell, said method comprising:
  storing a first priority for a first operation performed on the first plane, and a second priority for a second operation performed on the second plane; and
  upon receipt of a first command for the first plane to execute the first operation, the first operation including a first process, and a second command for the second plane to execute the second operation, the second operation including a second process, controlling the first operation and the second operation such that a timing of the first process in the first operation and a timing of the second process in the second operation are not overlapped, by delaying the first process or the second process based on the first priority and the second priority.

14. The method according to claim 13,
wherein the first process involves at least one of charging of the first word line or charging of the first bit line, and
wherein the second process involves at least one of charging of the second word line or charging of the second bit line.

15. The method according to claim 13, further comprising:
  when a value of the second priority is higher than a value of the first priority, delaying the first process until the second process ends; and
  when the value of the first priority is higher than the value of the first second priority, delaying the second process until the first process ends.

16. The method according to claim 14, further comprising:
  when the value of the second priority is higher than the value of the first priority, outputting a first signal that indicates a start of the second process in the second operation; and
  delaying a start timing of the first process in the first operation based on the first signal.

17. The method according to claim 16,
wherein a peak of current consumption in the second process is larger than an average current consumption of the second operation.

18. The method according to claim 17, further comprising:
  when the value of the first priority is higher than the value of the second priority, outputting a second signal that indicates the start of the first process in the first operation; and
  delaying the start timing of the second process in the second operation based on the second signal,
  wherein a peak of current consumption in the first process is larger than an average current consumption of the first operation.

19. The method according to claim 16,
wherein values of the first and second priorities are set based on an input order of the first and second commands, and at least one of the first and second commands includes a priority setting data.

20. The method according to claim 13, wherein
the first priority is set based on an instruction to change a priority of the first operation included in the first command.

* * * * *

UNITED STATES PATENT AND TRADEMARK OFFICE
CERTIFICATE OF CORRECTION

| | |
|---|---|
| PATENT NO. | : 11,099,787 B2 |
| APPLICATION NO. | : 16/841335 |
| DATED | : August 24, 2021 |
| INVENTOR(S) | : Naoya Tokiwa |

It is certified that error appears in the above-identified patent and that said Letters Patent is hereby corrected as shown below:

In the Claims

Column 39, Line 31, delete "such that".

Column 42, Line 2, delete "first".

Signed and Sealed this
Fifteenth Day of November, 2022

Katherine Kelly Vidal
*Director of the United States Patent and Trademark Office*